(12) United States Patent
Mahajan et al.

(10) Patent No.: US 10,739,729 B2
(45) Date of Patent: Aug. 11, 2020

(54) TIME-TO-DIGITAL CONVERTER

(71) Applicant: Intel Corporation, Santa Clara, CA (US)

(72) Inventors: Tarun Mahajan, Beaverton, OR (US); Dheeraj Shetty, Bangalore (IN); Ramnarayanan Muthukaruppan, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/242,953

(22) Filed: Jan. 8, 2019

(65) Prior Publication Data

US 2019/0212704 A1    Jul. 11, 2019

Related U.S. Application Data

(63) Continuation of application No. 15/462,732, filed on Mar. 17, 2017, now Pat. No. 10,175,655.

(51) Int. Cl.
| | |
|---|---|
| *H03M 1/50* | (2006.01) |
| *G04F 10/00* | (2006.01) |
| *G05F 1/56* | (2006.01) |
| *G06F 1/12* | (2006.01) |
| *G06F 1/06* | (2006.01) |
| *H03M 1/00* | (2006.01) |
| *H03M 1/12* | (2006.01) |
| *H03M 1/74* | (2006.01) |
| *H03L 7/089* | (2006.01) |
| *H03L 7/081* | (2006.01) |
| *H03L 7/10* | (2006.01) |

(52) U.S. Cl.
CPC ............ *G04F 10/005* (2013.01); *G05F 1/561* (2013.01); *G06F 1/06* (2013.01); *G06F 1/12* (2013.01); *H03M 1/502* (2013.01); *H03L 7/081* (2013.01); *H03L 7/089* (2013.01); *H03L 7/10* (2013.01); *H03M 1/00* (2013.01); *H03M 1/12* (2013.01); *H03M 1/742* (2013.01); *H03M 2201/4233* (2013.01)

(58) Field of Classification Search
CPC .. H03M 1/00; H03M 1/12; H03L 7/10; H03L 7/089; H03L 7/081
USPC ........ 341/168, 166, 155; 327/156, 157, 158, 327/159
See application file for complete search history.

(56) References Cited

U.S. PATENT DOCUMENTS

| | | |
|---|---|---|
| 2007/0110194 A1 | 5/2007 | de Obaldia |
| 2008/0238652 A1 | 10/2008 | Henzler et al. |
| | (Continued) | |

OTHER PUBLICATIONS

Advisory Action for U.S. Appl. No. 15/462,732, dated Jun. 15, 2018.

(Continued)

*Primary Examiner* — Joseph J Lauture
(74) *Attorney, Agent, or Firm* — Green, Howard & Mughal, LLP

(57) ABSTRACT

An apparatus is provided which comprises: a first clock line to provide a first clock; a second clock line to provide a second clock; a delay line having a plurality of delay cells, wherein the delay line is coupled to the first and second clock lines, wherein the first clock is to sample the second clock; and circuitry coupled to the delay line, wherein the circuitry is to determine first or latest edge transitions from the outputs of the plurality of delay cells.

23 Claims, 16 Drawing Sheets

(56) References Cited

U.S. PATENT DOCUMENTS

| | | |
|---|---|---|
| 2008/0297208 A1 | 12/2008 | Baudin et al. |
| 2012/0319883 A1 | 12/2012 | Cao |
| 2013/0257494 A1* | 10/2013 | Nikaeen .................... H03L 7/06 |
| | | 327/156 |
| 2015/0301505 A1 | 10/2015 | Tiner et al. |
| 2016/0282889 A1 | 9/2016 | Mahajan et al. |

OTHER PUBLICATIONS

Final Office Action for U.S. Appl. No. 15/462,732, dated Mar. 28, 2018.
International Search Report and Written Opinion for PCT Application No. PCT/US18/18820, dated May 23, 2018.
Non Final Office Action for U.S. Appl. No. 15/462,732, dated Sep. 7, 2017.
Notice of Allowance dated Sep. 11, 2018 for U.S. Appl. No. 15/462,732.
International Preliminary Report on Patentability dated Sep. 26, 2019 for PCT Patent Application No. PCT/US2018/018820.

* cited by examiner

| | Unit | An embodiment | PA1 | PA2 | PA3 | PA4 |
|---|---|---|---|---|---|---|
| Publication | - | | ISSCC 2015 | CICC 2010 | ASSCC 2011 | ESSCIRC 2015 |
| CMOS Technology | - | 14nm | 130nm | 65nm | 40nm | 65nm |
| Type of LDO control | - | Digital | Digital | Digital | Digital | Digital (async) |
| Nonlinear included | - | Yes | Yes (RDS) | No | - | No |
| Input Voltage Range | V | 1-1.15 | 0.5-1.2 | 0.5 | 1.34 | 0.6-1 |
| Output Voltage Range | V | 0.5-1.12 | 0.45-1.14 | 0.45 | 1.2 | 0.55-0.95 |
| Min Voltage Dropout (Vd) | V | 0.03 | 0.05 | 0.05 | 0.08 | 0.05 |
| Max. Load current | mA | 1500 (@Vd=30mV) 2200 (@Vd=50mV) | 4.6 | 0.2 | 250 | 500 |
| Load regulation | mV/mA | <0.006 | <10 | 0.65 | - | <0.25 |
| Peak current efficiency | % | 99.32 | 98.3 | 98.67 | 96 (@1GHz) | 99.94 |
| Power Stage Control - Equivalent Binary Bits | - | 10 | 7 | 8 | 5.8 | 9.5 |
| ADC Output - No. of Bits | - | >6 | 1 | 1 | - | - |
| ADC Conversion Delay | ns | <2.5 | - | - | <10 | - |
| Decoupling capacitor | nF | 18 | 1 | 100 (off-chip) | - | 1.5 |
| Active Area | mm² | 0.104 | 0.114 | 0.042 | 0.057 | 0.158 |
| Sampling Frequency | MHz | 400 (linear) 800 (nonlinear) | <80 (Adaptive) | 1 | 1000 | - |
| Droop Settling Time | ns | 14.2 | >300 | - | 70 | 50 |
| Max voltage droop @ load step | - | 100mV @ 1A/10ns | 40mV @0.7mA | 40mV @0.2mA | 50mV @114mA/5ns | 35mV @100mA/2ns |

TIME-TO-DIGITAL CONVERTER

CLAIM OF PRIORITY

This application is a continuation of U.S. patent application Ser. No. 15/462,732, filed on 17 Mar. 2017, and issued as U.S. patent Ser. No. 10/175,655 on 8 Jan. 2019, and titled "TIME-TO-DIGITAL CONVERTER", and which is incorporated by reference in entirety.

BACKGROUND

As device or transistor lengths are shrinking, it is getting harder to improve voltage resolution of conventional flash based analog-to-digital converters (ADCs). Alternatively, time-based ADCs are becoming popular due to improvement in gate delays leading to better time resolution. However, the conversion delay of such ADCs is not good enough for high bandwidth digital low dropout (LDO) regulators or other applications requiring fast response times.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 14 illustrates a table showing performance of the LDO of FIG. 1 over prior art LDOs, according to some embodiments of the disclosure.

DETAILED DESCRIPTION

Figure 1:
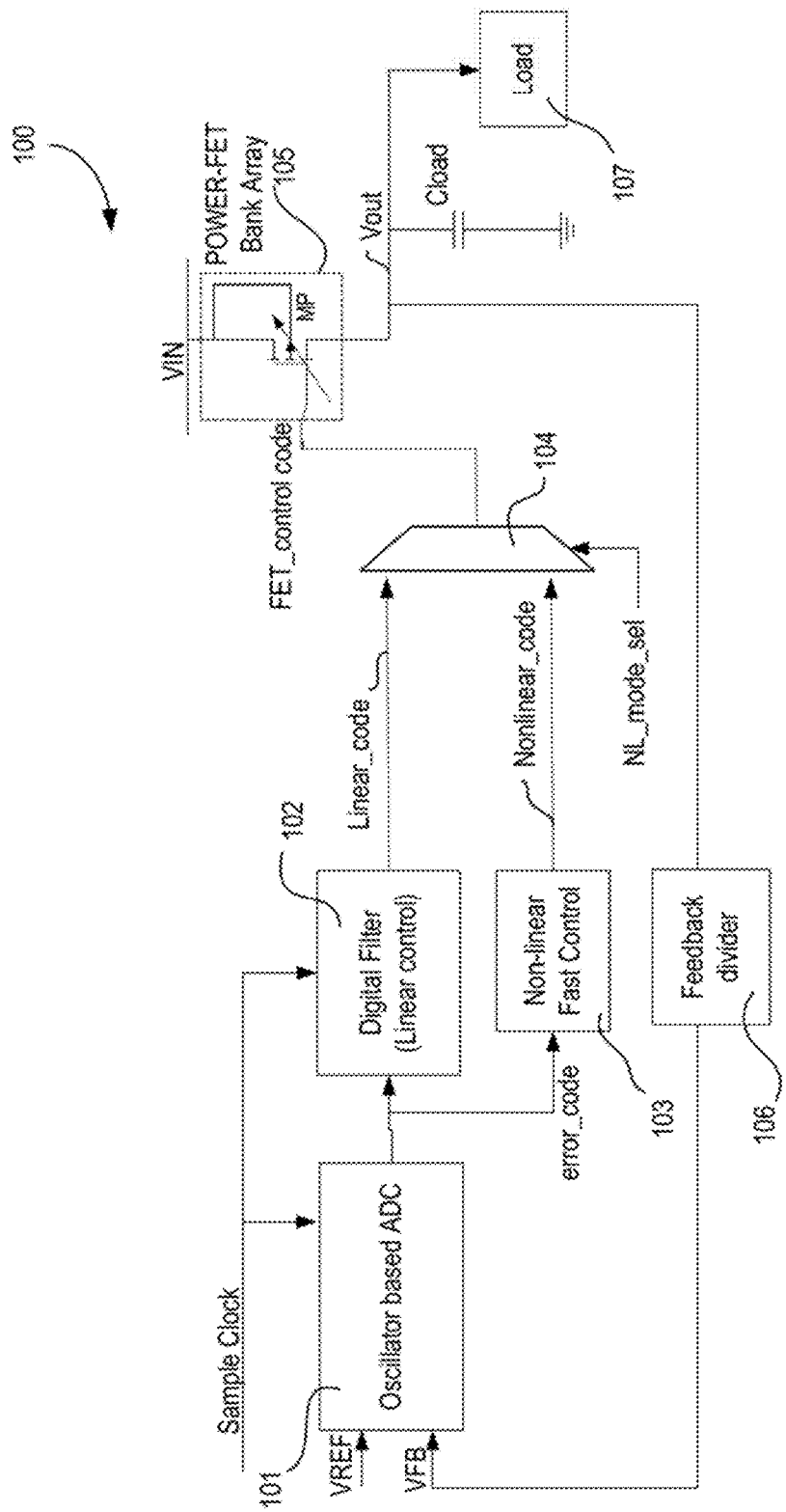
FIG. 1 illustrates a digitally controlled low dropout (LDO) regulator having an oscillator based analog-to-digital converter (ADC) which includes a time-to-digital converter (TDC), according to some embodiments of the disclosure.

Modern day multi-core CPU's (central processing unit) want to enable per-processing core Dynamic Voltage Frequency Scaling (DVFS) for energy efficiency. However, modern hand-held devices (e.g., a smart phone) look for cost-optimization by merging of the supply rails on the System-on-Chip (SoC). A CPU core powered by a shared supply rail would have energy wastage if other logic blocks in the CPU require higher supply voltage for higher performance. To improve energy efficiency, a fully-integrated digitally-controlled voltage regulator (VR) with autonomous DVFS provides a cost-effective solution as digital circuits can operate better at sub-1V supply voltage and are easy to migrate across process technology nodes.

An ADC is still used to convert voltage error into a digital code to feed into the digital controller. Time-based ADCs show improved resolution as gate delays are reducing with each technology node. These time-based ADCs come as an area-efficient alternative to conventional flash ADC. Some embodiments describe a digitally controlled VR which achieves a fast-transient-response using a high-speed medium-resolution oscillator based ADC and novel nonlinear control logic, and supports wide dropout range ensuring reliability over product life-time, and greater wide load current range (e.g., greater than 22×) for high-load applications.

Time-based ADCs are area-efficient and find their usage in digitally-controlled closed-loop systems such as digital LDO's to convert analog error voltage into a digital error code to feed to the digital controller. Digital LDOs use high bandwidth for fast transient response to meet the performance requirements of modern day loads (e.g., computing systems).

High bandwidth digital LDO's use a controller sampling frequency, for example in 100's of MHz (Mega-Hertz), to mitigate voltage droop. For stable closed-loop response of the LDO, loop delay due to analog to digital conversion is to be kept low. If the closed-loop response of the LDO is slow, then the LDO may not be able to respond dynamically to large di/dt events on the output node. A large di/dt event causes a voltage droop which is a significant lowering of the output voltage provided by the LDO or any regulator on the output supply node. Such voltage droop may cause logic operating on that power supply to malfunction. The recovery of the output from a droop event can be made quick and smooth if saturation of the ADC is avoided.

Traditional ring oscillator based ADCs have large conversion delay as the TDC logic associated with them use averaging of the oscillator frequency over a sampling clock period. Traditional Counter-based TDCs use multiple phases of an oscillator to get higher resolution. However, multiple phases add more burden on the ring oscillator design.

Various embodiments, describe an oscillator based ADC which is area-efficient over a conventional flash ADC. In some embodiments, an apparatus is provided which comprises a Time-to-Digital Converter (TDC) that reduces the conversion delay for oscillator-based ADCs significantly compared to existing techniques. The apparatus of various embodiments convert the time-domain clock period into a digital code with higher resolution and much less delay than existing techniques. The TDC apparatus of various embodiments works on a single-phase and avoids averaged frequency conversion, and rather looks at the latest clock period info.

In an LDO, as error is changing during a supply voltage droop event, the oscillator clock frequency is also continuously changing and it is desirable to extract the latest error information from the sampled data pattern. This assists in faster detection of droop event and to initiate necessary correction much faster. Some embodiments describe a delay-line based TDC that uses the latest clock cycle period to convert a time domain signal into a digital binary code. As such, the TDC of various embodiments ensures minimum possible delay from voltage error input to an ADC output. In some embodiments, TDC post-processing logic is provided which counts the length of the sampled data pattern of the delay line (e.g., 000011110001111 . . . 11 or similar) from latest 0→1 or 1→0 transition to the previous similar transition to ensure the most recent clock cycle is used to convert input into a digital code. The most recent transition depends on the oscillator clock phase at the input of the delay line at the sampling instance, in accordance with some embodiments.

In some embodiments, the apparatus extracts a delta (or a difference) count for both 0→1 and 1→0 transitions in parallel and selects the final count based on the latest edge information. The apparatus of various embodiments is able to generate a digital error code with very little combinational delay and hence makes the ADC high-speed apart from being high-resolution and area-efficient. While the various embodiments describe the TDC for use in an LDO, other uses of the TDC are also possible. For example, the TDC of various embodiments may be used in a phase locked loop (PLL), an ADC, or any feedback system.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front," "back," "top," "bottom," "over," "under," and the like in the description and in the claims, if any, are used for descriptive purposes and not necessarily for describing permanent relative positions.

FIG. 1 illustrates a digitally controlled LDO regulator 100 (hereinafter referred to as LDO) having an oscillator based ADC which includes a TDC, according to some embodiments of the disclosure.

In some embodiments, LDO 100 comprises oscillator based ADC 101, digital filter 102 with linear control, logic 103 to provide non-linear fast control, multiplexer 104, power gates 105, input supply line (or node) VIN to provide input power supply VIN, feedback divider 106, load capacitor Cload, and output supply line Vout to provide output voltage Vout. Here, reference to node names and signal names are interchangeably used. For example, "Vout" may refer to an output voltage or node providing that voltage depending on the context of the sentence. The output of LDO 100 is a regulated voltage Vout provided to a load 107 (e.g., processor, processor core, cache, graphics logic, or any other logic block).

LDO 100 is an application of an oscillator based ADC which allows the LDO 100 to meet high bandwidth specifications for general processor type loads. For example, the oscillator based ADC can provide high-speed analog to digital conversion with at least 6 bit resolution for +/−150 mV (milli-volts) error input range to avoid saturation in the ADC, and hence improve the LDO controller response. In various embodiments, the ADC conversion delay is minimized for reducing loop delay and to enable faster droop detection during load transients using the TDC of block 101.

In some embodiments, oscillator based ADC 101 receives sample clock (e.g., 400 MHz), reference voltage VREF, and feedback voltage VFB. In some embodiments, VFB is the same as the output voltage Vout. In some embodiments, VFB is a divided form of Vout. For example, Feedback divider 106 receives Vout and divides Vout down to generate VFB. The difference between VREF and VFB is provided as an error code (error_code) which is then provided to Digital Filter 102 and logic 103. In some embodiments, Digital Filter 102 compensates the loop for stability and provides close to zero-error in steady-state by applying linear control. The output of Digital Filter 102 is Linear_code, which is input to multiplexer 104. In some embodiments, error_code is also processed by logic 103, which applies non-linear fast control to the error_code. The output of logic 103 is Nonlinear_code.

In some embodiments, multiplexer 104 is a digital multiplexer which is operable to select one of the Linear_code or Nonlinear_code according to a select signal NL_mode_sel (non-linear or linear mode select signal). In some embodiments, NL_mode_sel is generated by a Non-linear logic module on detection of a supply voltage droop event which triggers Non-Linear entry and NL_mode_sel goes HIGH. In some embodiments, the output of multiplexer 104 is FET_control code which is used to turn on/off one or more power gates 105 (e.g., in a POWER-GET Bank Array). Power gates are transistors which here are represented as p-type transistors MP. Power gates can also be n-type transistors or a combination of p-type and n-type transistors. The output of the power gate 105 is Vout which is provided directly as VFB or divided down by Feedback divider 106. The output supply voltage sees a load capacitor Cload, which can be present in any form and the value can be based on area available on-die preferably over the load (e.g., transistors based, metal mesh, a combination of transistor and a metal mesh, etc.). The regulated output voltage is provided to load 107.

Figure 2:
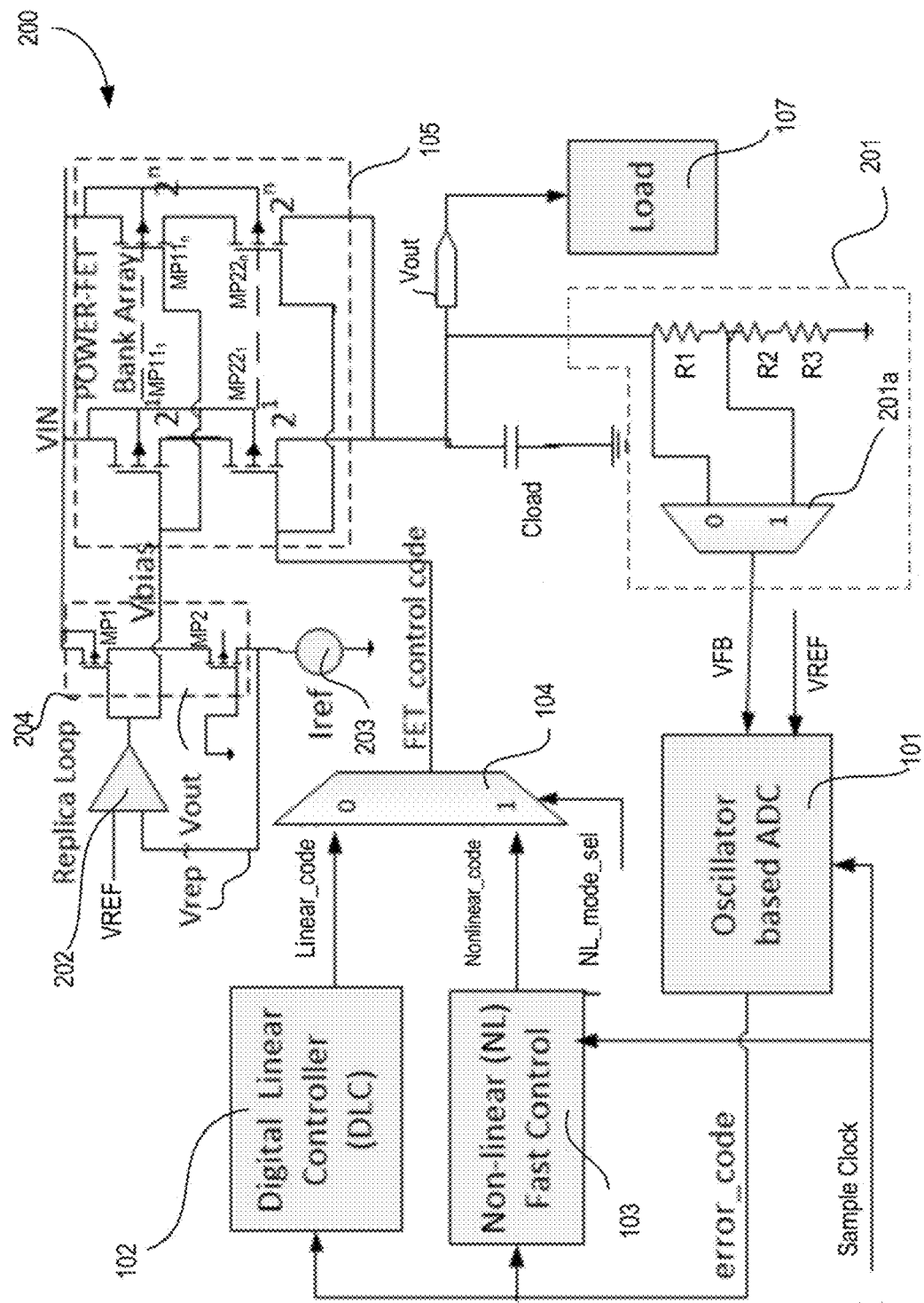
FIG. 2 illustrates a more detailed version of the LDO regulator of FIG. 1, according to some embodiments of the disclosure.

FIG. 2 illustrates a more detailed apparatus 200 of LDO 100 of FIG. 1, according to some embodiments of the disclosure. It is pointed out that those elements of FIG. 2 having the same reference numbers (or names) as the elements of any other figure can operate or function in any manner similar to that described, but are not limited to such. Apparatus 200 describes one possible implementation of feedback divider 106 which is indicated as divider 201. Here, divider 201 includes multiplexer 201a and a resistor divider network having resistors R1, R2, and R3, where resistor R1 is coupled to node Vout. Any number of resistors may be used for forming the resistor divider network. The resistors may be implemented as transistors operating in a linear transistor operation region or other technology specific devices (e.g., poly lines). Multiplexer 201a can be used to select one of the divided voltages as VFB for Oscillator based ADC 101, in accordance with some embodiments.

In some embodiments, the output voltage Vout is fed back as undivided voltage (e.g., in 0.5 V to 0.75 V output range), and divided (e.g., by $2/3^{rd}$ ratio in 0.75 V to 1.1 V range) in order to limit VFB in the common-mode range of the ADC (e.g., in the 0.5 V to 0.75 V range) to ensure high performance.

In some embodiments, bandgap reference voltage goes to a resistor digital-to-analog converter (R-DAC) such as a 7-bit R-DAC to generate VREF corresponding to a desired output voltage. In some embodiments, the error voltage (e.g., VFB-VREF) is converted into a digital error code (error_code) using oscillator-based ADC 101 at both edges of a sampling clock Fclk (e.g., 400 MHz). This error code is fed to digital filter 102 (also referred to as DLC) for loop compensation as well as to the nonlinear digital control logic 103 for droop reduction and fast recovery during load transients. Hence, having a fast analog-to-digital conversion of the voltage error with good resolution and range can improve performance of the voltage regulation process. In some embodiments, the final controller output FET_control code from multiplexer 104 (e.g., 10-bit binary code) controls the turn on/off operation of the binary-weighted Power-Gate Array 105 to maintain the desired output voltage from the regulator.

In some embodiments, the Power-Gate Array 105 is implemented using stacked p-type transistors. For example, p-type transistors $MP11_1$ stacked with $MP22_1$, ... and $MP11_n$ stacked with $MP22_n$, where 'n' is a number. In some embodiments, these stacked transistors behave as a constant current-source at dropout of a certain level (e.g., greater than 100 mV of dropout) to ensure reliability over a life-time by limiting the current per leg in the array as dropout increases.

In some embodiments, further apparatus comprising comparator or amplifier 202, current source (Iref) 203, and biasing network 204 having transistors MP1 and MP2 are provided to generate Vbias (a bias voltage). In some embodiments, the replica loop generates Vbias for the top p-type transistor to maintain nearly constant current per leg set by current Tref in the replica branch. At certain voltage dropouts (e.g., less than 100 mV), the p-type stack of transistors in array 200 behaves as a resistor fully-ON as the Vbias drops to ground and current per leg (e.g., a stack comprising $MP11_1$ and $MP22_1$) is within safe limits. In some embodiments, the bottom p-FET in the stack (e.g., $MP22_1$) is an on/off switch digitally controlled by FET_control code based on a number of legs to be turned ON in array 105 to source the current required by load 106.

Figure 3:
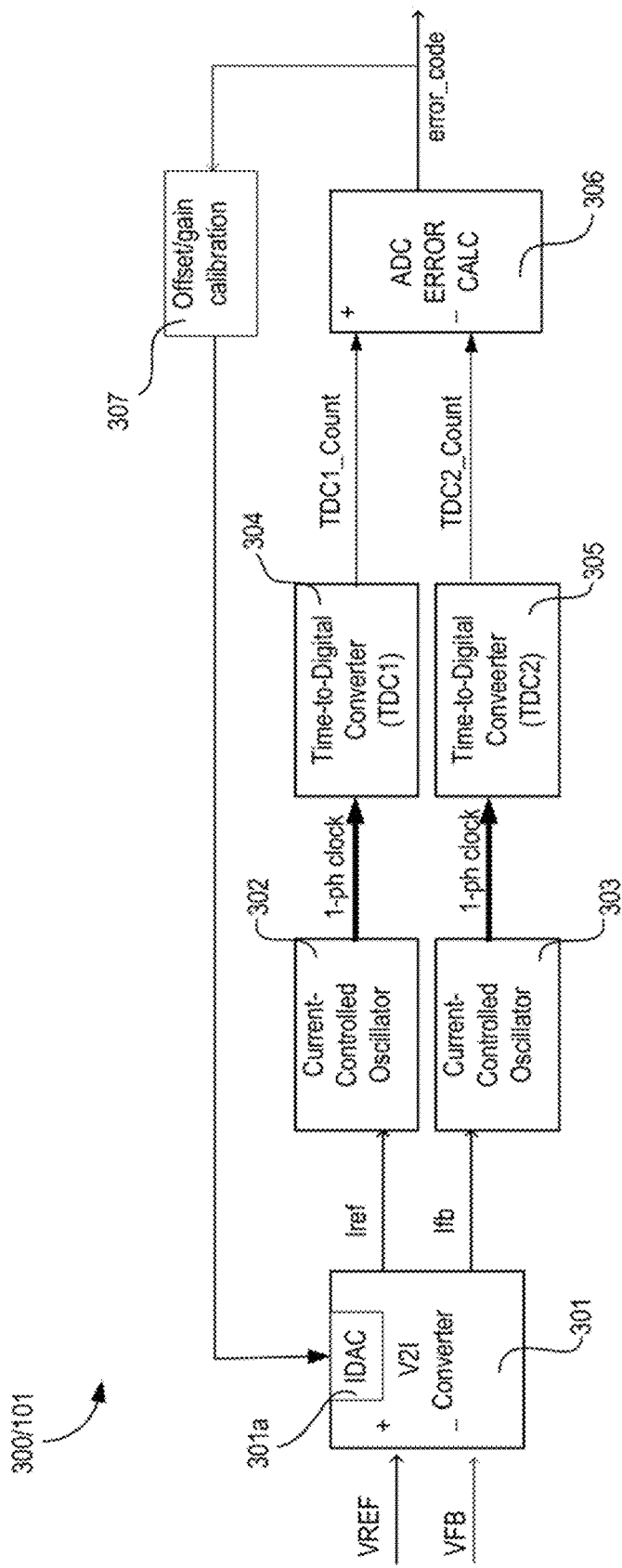
FIG. 3 illustrates the oscillator based ADC with two TDCs, according to some embodiments of the disclosure.

FIG. 3 illustrates an oscillator based ADC 300 (e.g., 101) with two TDCs 304 and 305, respectively, according to some embodiments of the disclosure. It is pointed out that those elements of FIG. 3 having the same reference numbers (or names) as the elements of any other figure can operate or function in any manner similar to that described, but are not limited to such.

In some embodiments, oscillator based ADC 300/101 comprises a voltage-to-current (V2I) converter 301, current digital to analog converter (iDAC) 301a, first Current Controlled Oscillator 302, second Current Controlled Oscillator 303, first TDC (TDC1) 304, second TDC (TDC2) 305, analog to digital error calculator (ADC ERROR CALC) 306, and Offset/gain calibration circuitry 307 coupled together as shown.

In some embodiments, the differential error voltage (VREF-VFB) is converted to differential current by V2I Converter 301, and this differential current (e.g., Ifb-Iref) is fed to single-ended oscillators 302 and 303. Here, the differential current is a reference current Tref corresponding to VREF, and feedback current Ifb corresponding to VFB. In some embodiments, the frequency of the two oscillators 302 and 303 drift apart based on differential voltage error in a monotonic linear fashion. In some embodiments, the oscillator single-phase clock output (1-ph clock) is fed to the TDC to convert the latest clock period into a digital binary code. For example, the output 1-ph clock of Current-Controlled Oscillator 302 is fed into TDC1 304, and the output 1-ph clock of Current-Controlled Oscillator 303 is fed into TDC1 305. The delta in the TDC count (e.g., difference of TDC1_Count and TDC2_Count) from the two TDCs 304 and 305 is then fed into ADC ERROR CALC and used to get the final digital error code "error_code".

In some embodiments, oscillator based ADC 300 is calibrated by Offset/gain Calibration circuitry 307 to zero offset initially (e.g., during power-up or during calibration mode) by shorting the inputs (VREF and VFB) to V2I Converter 301 and adjusting the V2I current legs using I-DAC 301a (current DAC) within V2I Converter 301. In some embodiments, using two oscillators 302 and 303 and two TDCs 304 and 305 running in parallel cancels the effect of temperature variation on the oscillator frequencies. Another technical effect for having the two oscillators 302 and 303 and two TDCs 304 and 305 running in parallel is that the frequencies may not vary with common-mode within common-mode range of V2I Converter 301, thus allowing oscillator based ADC 300 usage in wide output voltage range applications.

Figure 4:
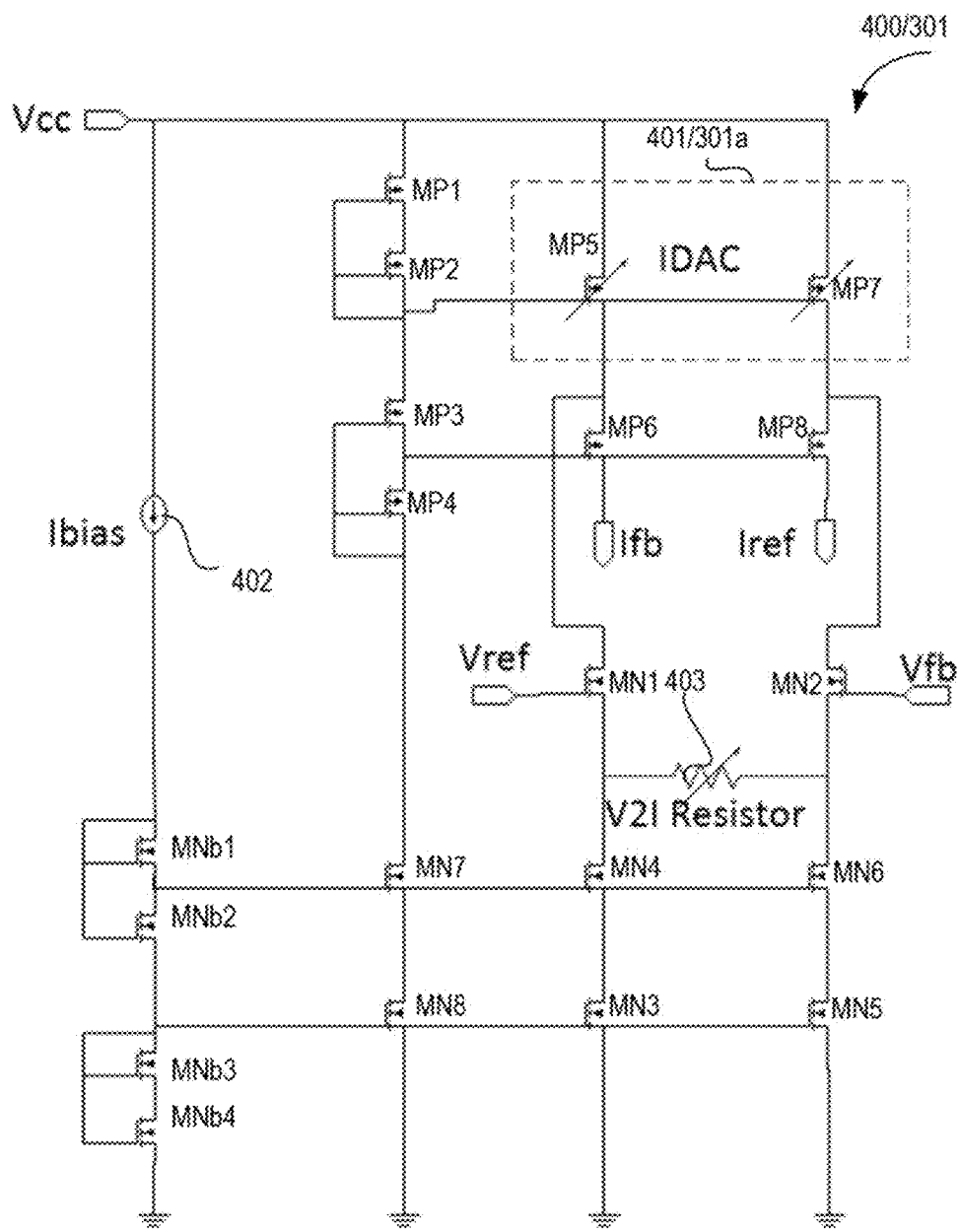
FIG. 4 illustrates a voltage-to-current (V2I) converter for the oscillator based ADC, according to some embodiments of the disclosure.

FIG. 4 illustrates V2I converter 400 (e.g., 301) for the oscillator based ADC, according to some embodiments of the disclosure. It is pointed out that those elements of FIG. 4 having the same reference numbers (or names) as the elements of any other figure can operate or function in any manner similar to that described, but are not limited to such.

In some embodiments, V2I converter 400 comprises p-type transistors MP1, MP2, MP3, MP4, MP5, MP6, MP7, and MP8, where MP5 and MP7 are part of iDAC 401/301a; n-type transistors MN1, MN2, MN3, MN4, MN5, MN6, MN7, and MN8; n-type transistors for biasing MNb1, MNb2, MNb3, and MNb4; bias current source 402, and V2I variable resistor 403 coupled together as shown. Input voltages VREF and VFB are received by n-type transistors MN1 and MN2, and are converted to corresponding currents Iref and Ifb, respectively.

In some embodiments, during calibration mode, inputs VREF and VFB are tied together, and the offset of V2I Converter 400/301 is calibrated. In some embodiments, the offset of V2I Converter 400/301 is adjusted or cancelled to zero by adjusting the current drive strength of p-type transistors MP5 and MP7. In some embodiments, the current drive strength of p-type transistors MP5 and MP7 is adjusted by Offset/gain calibration circuitry 307. In some embodiments, the gain of V2I Converter 400/301 is almost linear in the desired range and can be adjusted to get a desired ADC resolution and range by trimming the V2I resistor 403.

Figure 5:
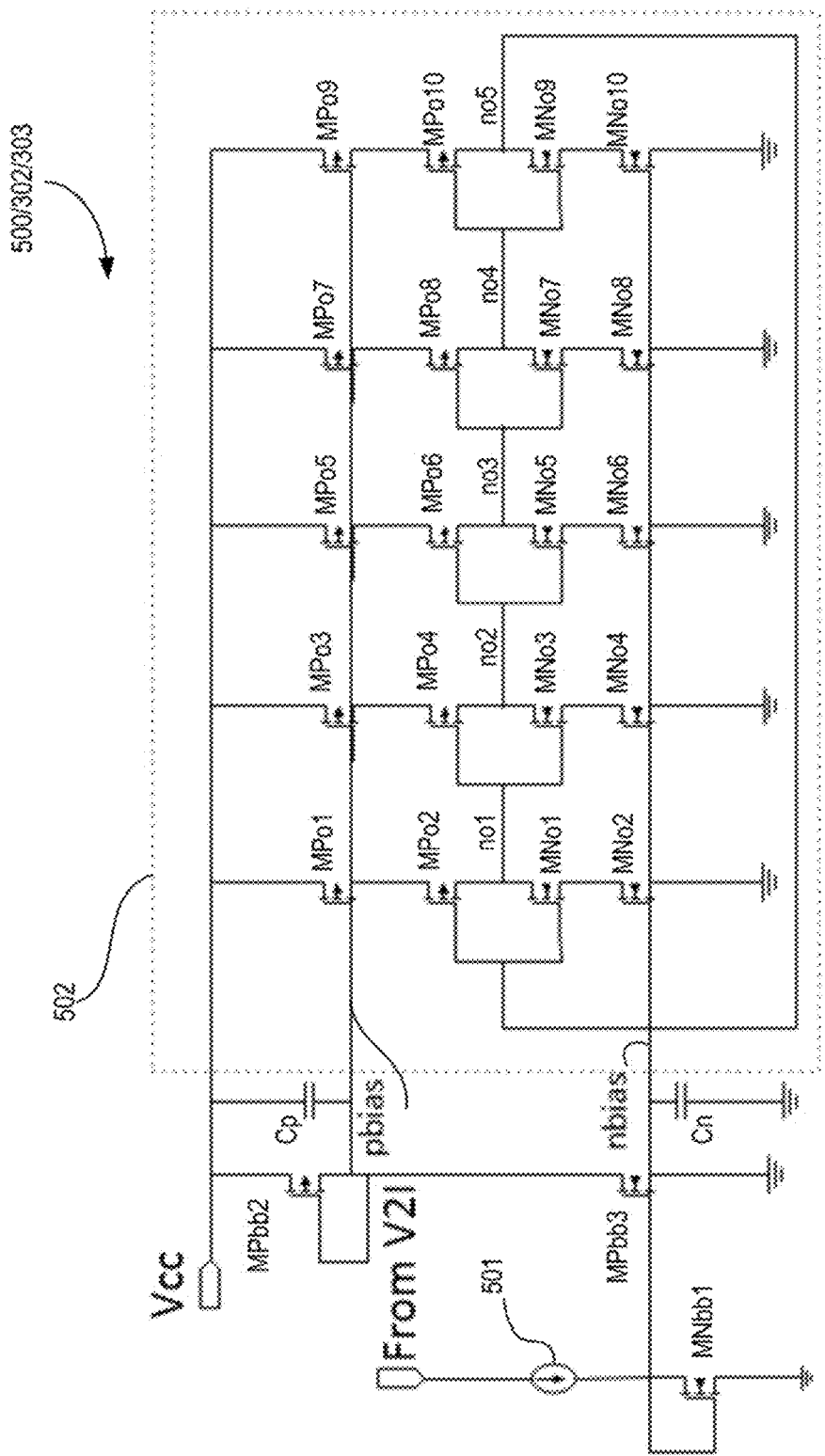
FIG. 5 illustrates a current-controlled oscillator for the oscillator based ADC, according to some embodiments of the disclosure.

FIG. 5 illustrates current-controlled oscillator 500 (e.g., 302 and 303) for the oscillator based ADC, according to some embodiments of the disclosure. It is pointed out that those elements of FIG. 5 having the same reference numbers (or names) as the elements of any other figure can operate or function in any manner similar to that described, but are not limited to such.

In some embodiments, current-controlled oscillator 500 comprises bias current source 501 that receives current input (e.g., one of Iref or Ivb) from V2I Converter 400/301, five delay cells forming oscillator 502, p-type bias transistor MPbb2, n-type bias transistor MPbb3, p-type capacitor Cp, and n-type capacitor Cn coupled together as shown. In some embodiments, five delay cells forming oscillator 502 comprises p-type devices MPo1, MPo2, MPo3, MPo4, MPo5, MPo6, MPo7, MPo8, MPo9, and MPo10; and n-type devices MNo1, MNo2, MNo3, MNo4, MNo5, MNo6, MNo7, MNo8, MNo9, and MNo10 coupled together as shown. Here, a delay cell includes an inverting stage.

For example, the first delay cells comprises transistors MPo1, MPo2, MNo1, and MNo2. The delay cells are coupled together by nodes no1, no2, no3, no4, and no5. While current-controlled oscillator 500 is described as having five delay cells, any number of delay cells may be used according to a desired oscillating frequency. In some embodiments, nbias and pbias voltages bias the current starved oscillator delay cells. For example, nbias controls the sink current of transistors MNo2, MNo4, MNo6, MNo8, and MNo10, while pbias controls the source current of transistors MPo1, MPo3, MPo5, MPo7, and MPo9.

Figure 6:
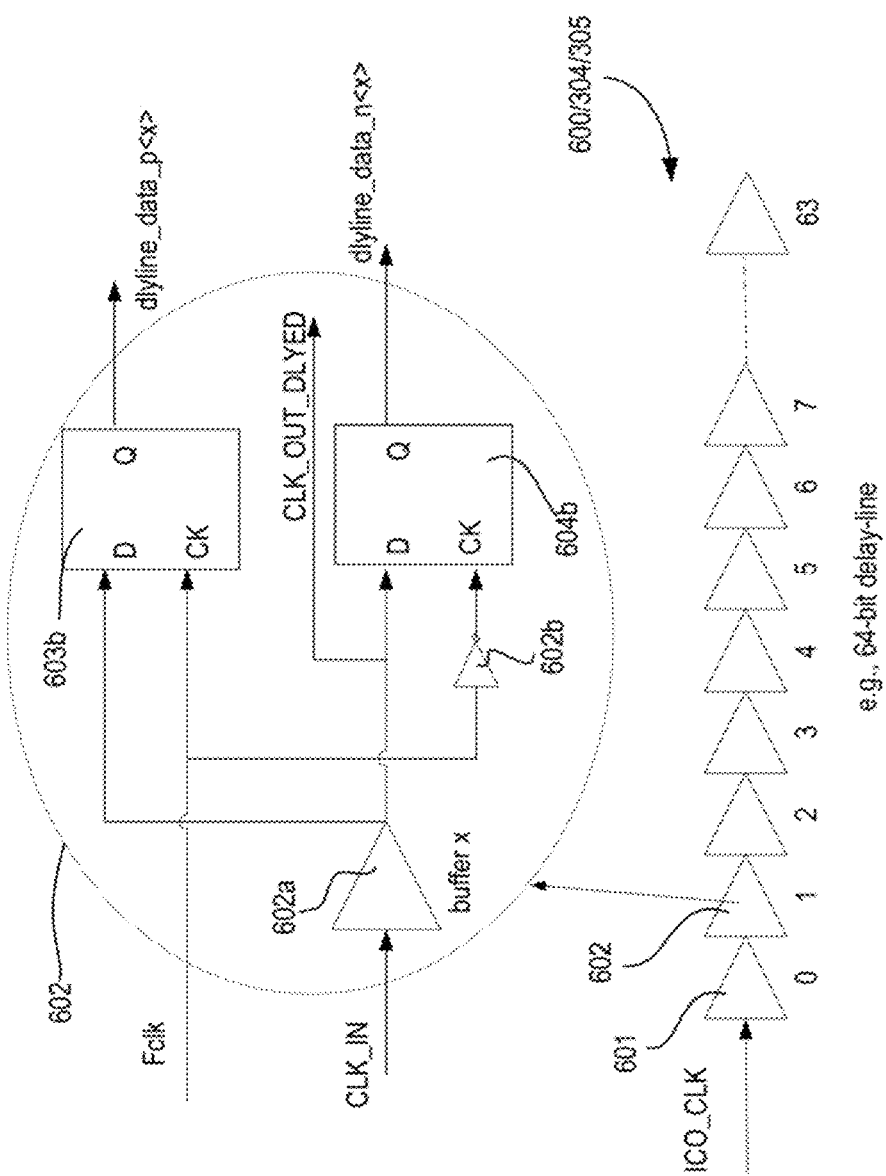
FIG. 6 illustrates a TDC delay line and a corresponding delay cell of the delay line, according to some embodiments of the disclosure.

FIG. 6 illustrates TDC delay line 600 (e.g., 304 and 305) and a corresponding delay cell of the delay line, according to some embodiments of the disclosure. It is pointed out that those elements of FIG. 6 having the same reference numbers (or names) as the elements of any other figure can operate or function in any manner similar to that described, but are not limited to such.

In this example, TDC delay line 600 is a 64-bit delay-line (e.g., delay cells 601, 602, and so on). However, the embodiments are not limited to a 64-bit delay-line. The length of the delay-line can be set according to a desired range of ADC 300. Here, the input ICO_CLK is an output of one of the oscillators (302 and 303) which is received by the CLK_IN input of a delay cell. One implementation of a delay cell (e.g., delay cell 602) is shown here which comprises clock buffer 602a, sampling clock (Fclk) inverter 602b, and samplers 603b and 604b coupled together as shown. The samplers can be a d-flip-flip, for example. In some embodiments, each delay cell provides a differential output—dlyline_data_p and dlyline_data_n. A person skilled in the art would appreciate that delay line 600 can be differential or single-ended.

In some embodiments, a time-domain single-phase clock signal (e.g., ICO_CLK) from each oscillator (e.g., 302 and 303) is passed through this high-resolution delay line 600 (e.g., with 12 ps (picoseconds) to 18 ps delay per stage). In some embodiments, each buffer stage output in delay line 600 is sampled at both clock edges of sampling clock Fclk (e.g., 400 MHz) to take a time stamp of delay line 600 more frequently (e.g., every 1.25 ns (nanoseconds)). In some embodiments, the total length of delay line 600 is chosen to cover more than the maximum clock period of the input clock (e.g., 1.5× the maximum clock period) to ensure at-least one full clock period is captured in the sampled data pattern. However, there can be more than one clock period info available in the data pattern based on maximum oscillator clock frequency, in accordance with some embodiments.

Figure 7:
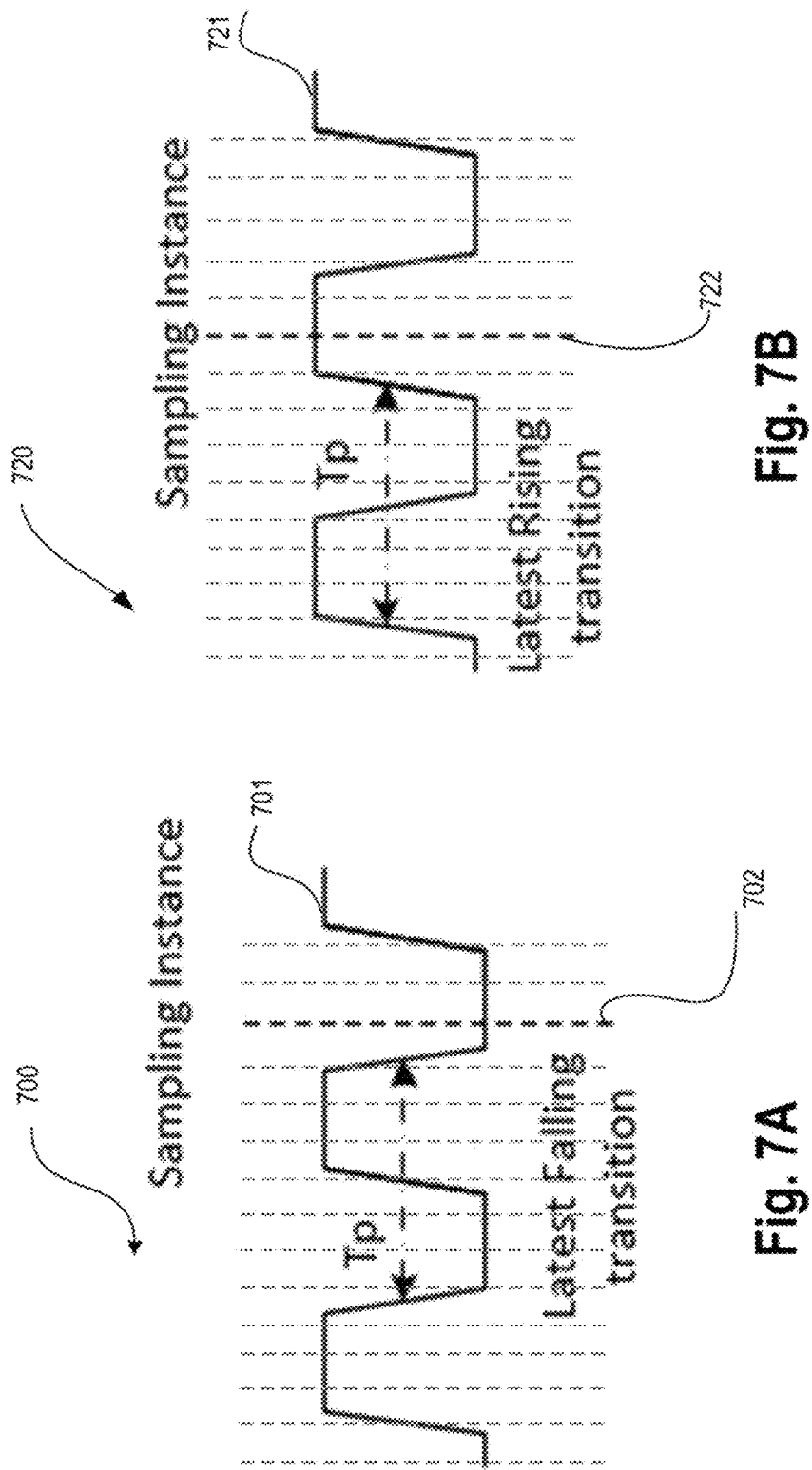
FIGS. 7A-B illustrate waveforms indicating clock at various sampling instances, according to some embodiments of the disclosure.
Figure 10:
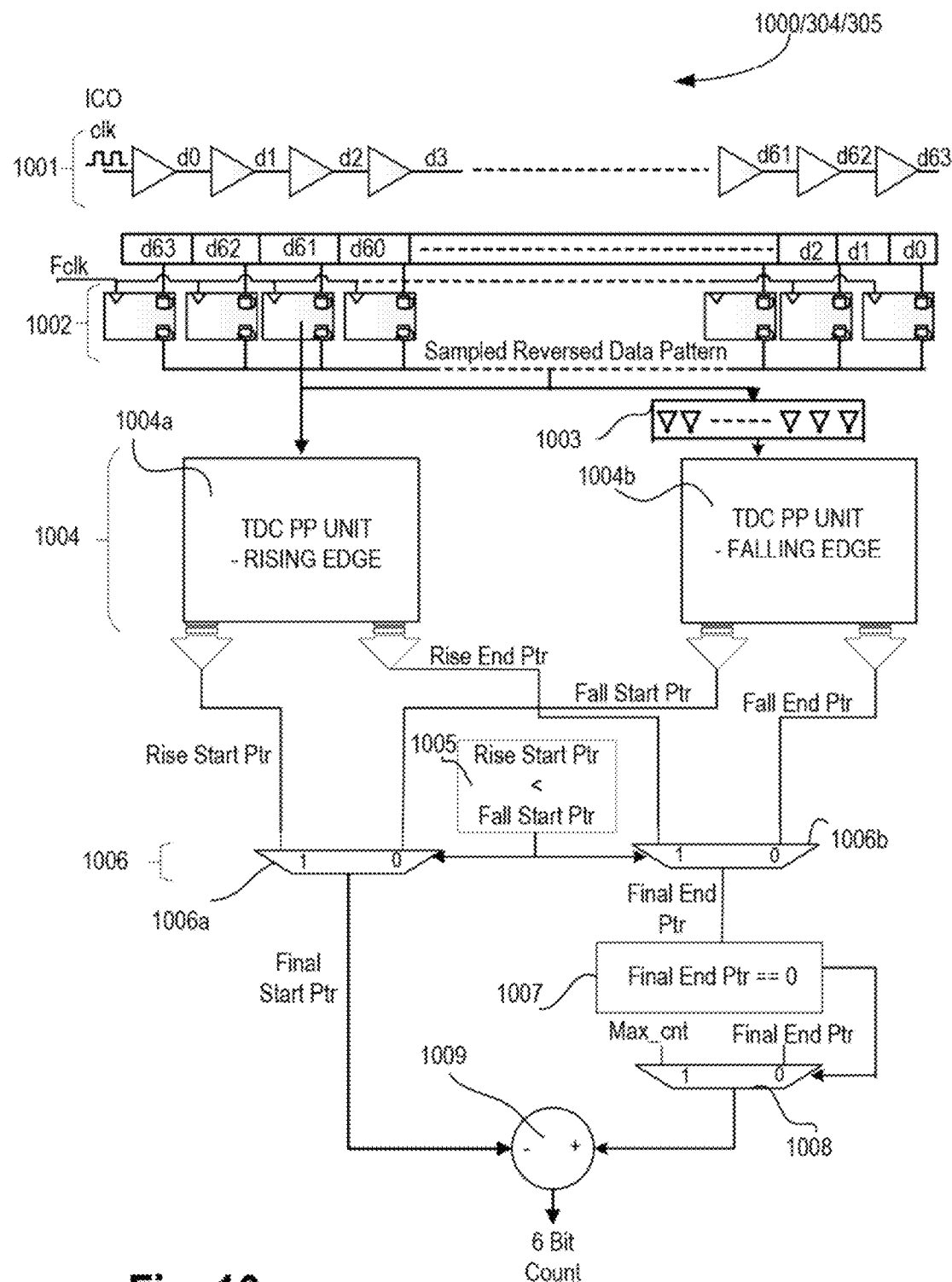
FIG. 10 illustrates a TDC post processing logic circuitry, according to some embodiments of the disclosure.
Figure 11:
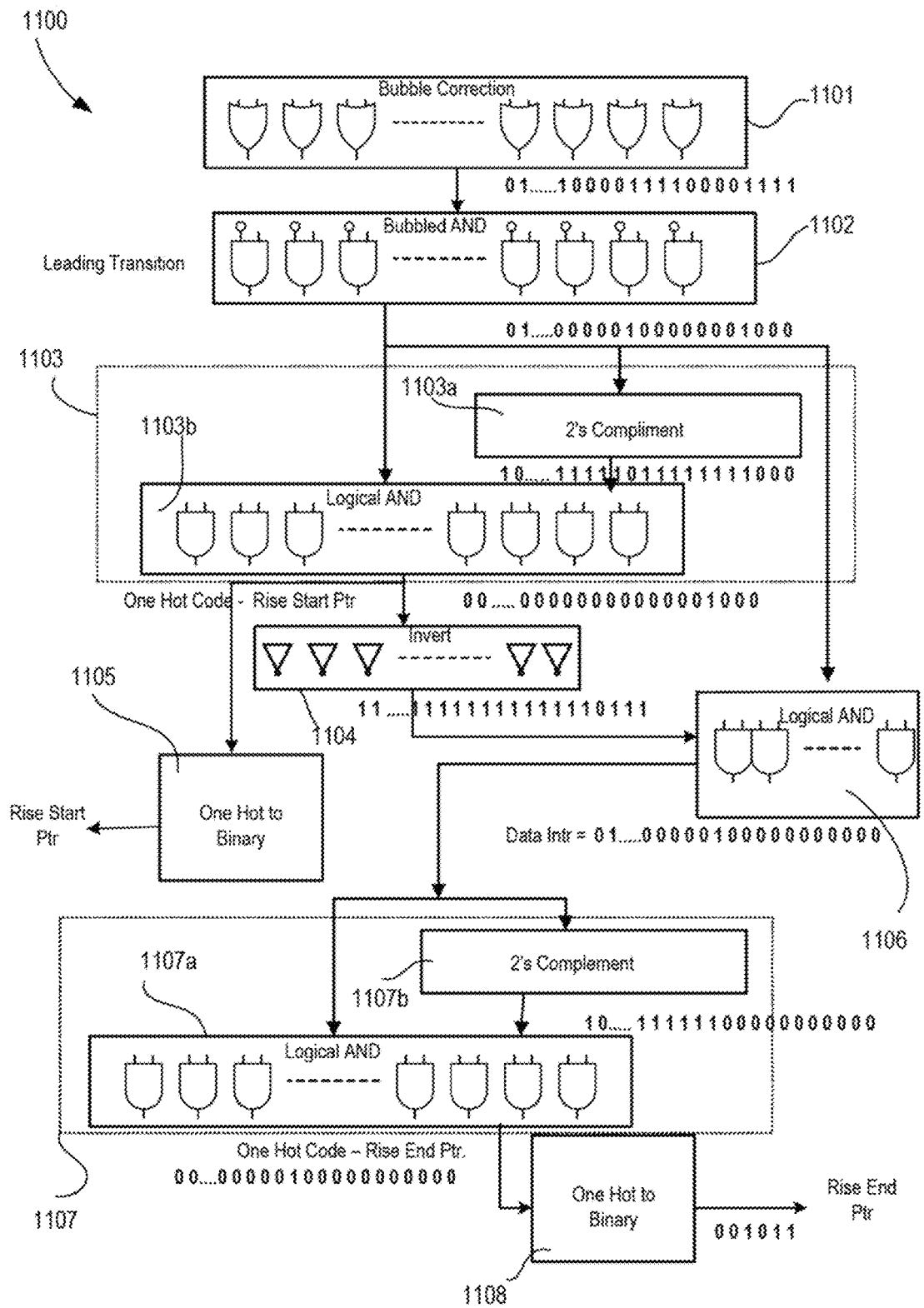
FIG. 11 illustrates a circuitry, in the TDC post processing logic circuitry, for determining start and end pointers of a clock edge input to the TDC, according to some embodiments of the disclosure.

In some embodiments, the sampled data is bubble-corrected as shown in FIGS. 10-11 to get a stream of repeating 0's and 1's with their length varying with the clock period for e.g., 0000<u>01</u>1110<u>01</u>111 . . . 11 or similar. It is then fed to the digital post-processing logic or circuitry to extract the latest clock period info from the data pattern. In various embodiments, the post-processing logic or circuitry is a combinational logic which has very little latency. In some embodiments, the post-processing logic or circuitry counts the length of the data pattern from latest 0→1 or 1→0 transition to the previous similar transition as shown in FIG. 7 to ensure the latest clock period information is used to convert into a digital code.

FIGS. 7A-B illustrate waveforms 700 and 720, respectively, indicating clocks 701 and 721, respectively, at various sampling instances (e.g., dotted vertical lines), according to some embodiments of the disclosure. The light shaded dotted lines are the various sampling points (e.g., sampling of data by Fclk), and the dark dotted line is the sampling point which indicates the latest edge transition. For plot 700, the dark dotted line 702 indicates the sampling point of the latest falling transition which is used to determine the time period Tp of the data (which is a clock here). For plot 720, the dark dotted line 722 indicates the sampling point of the latest rising transition which is used to determine the time period Tp of the data (which is a clock here).

As an example, the 64-bit sampled output after bubble correction would look like 000<u>11</u>11100000<u>1</u>11 . . . 11, where the latest edge is a rising transition 0→1, or like 11 1<u>0000</u>011111<u>000</u> . . . 00, where the latest edge is a falling transition 1→0. In some embodiments, the post-processing combinational logic computes the delta (or difference) in the position of the latest transition to the previous similar transition as underlined for both scenarios. Any change in the oscillator frequency reflects a change in the number of 0's or 1's repeating in the data pattern, according to some embodiments. As such, the TDC of various embodiments gets closest to extracting the instantaneous frequency of the oscillator in terms of a digital code.

Figure 8:
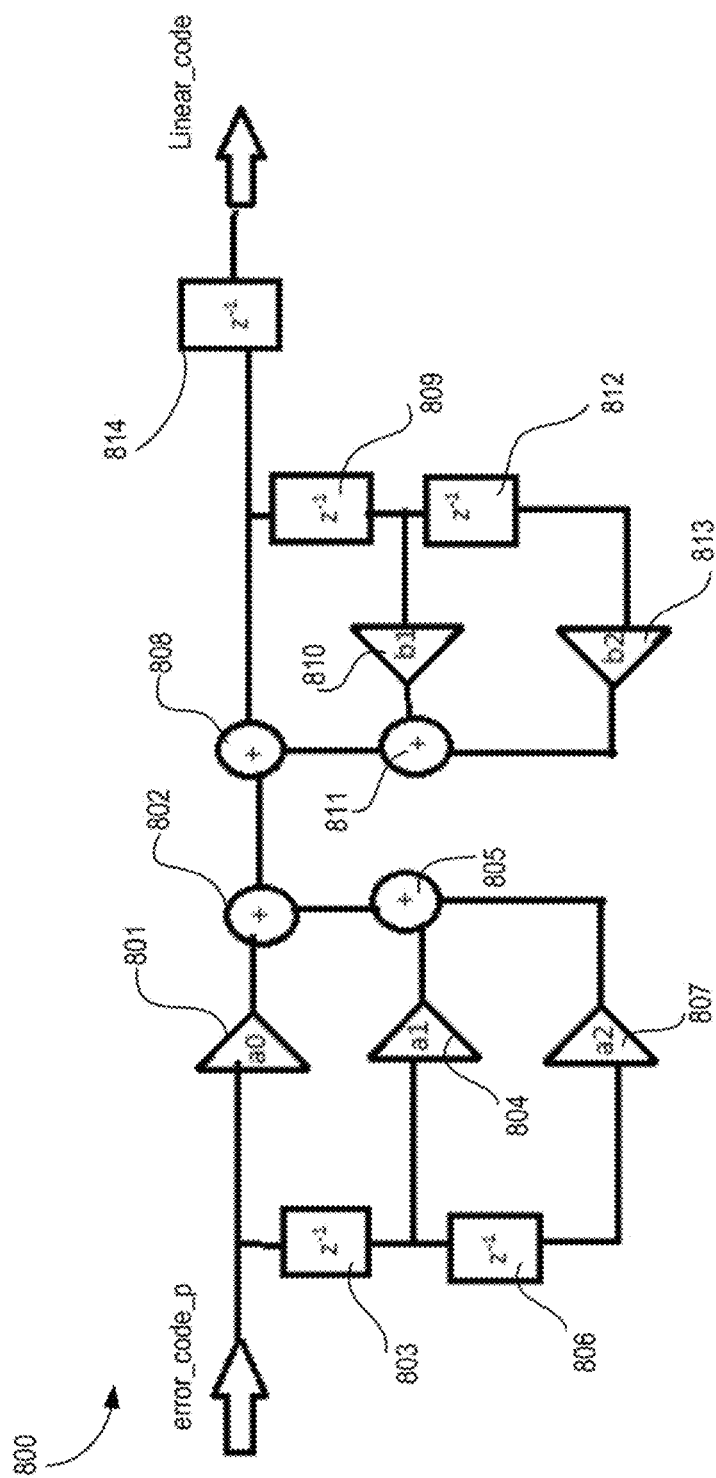
FIG. 8 illustrates a digital linear controller for the digital LDO regulator, according to some embodiments of the disclosure.

FIG. 8 illustrates digital linear controller (DLC) 800 for the digital LDO regulator, according to some embodiments of the disclosure. It is pointed out that those elements of FIG. 8 having the same reference numbers (or names) as the elements of any other figure can operate or function in any manner similar to that described, but are not limited to such. In some embodiments, DLC 800 comprises delay stages 803, 806, 809, 812, and 814; summing nodes 802, 805, 808 and 811; and filter coefficients a0 801, a1 804, a2 807, b1 810, and b2 813. The input to DLC 800 is "error_code_p" and the output is "Linear code".

In some embodiments, DLC 800 is a Type-2 digital compensator which takes the ADC error code on every positive clock edge and gives out Linear code every cycle. In some embodiments, DLC 800 adds an integrator to remove static offset error and a pole-zero pair to ensure loop stability and desired bandwidth across wide load current and output voltage range as compared to using just an integrator. In some embodiments, the coefficients of the filter are programmable which makes the design re-configurable across different specifications.

During fast load transients, DLC 800 response may not be fast enough to limit the droop within reasonable limits. Alternatively, a fast nonlinear (NL) control logic 103 shown in FIG. 9 is used to detect a droop event quickly and take corrective action to limit the droop at the output and initiate a smooth and speedy recovery.

Figure 9:
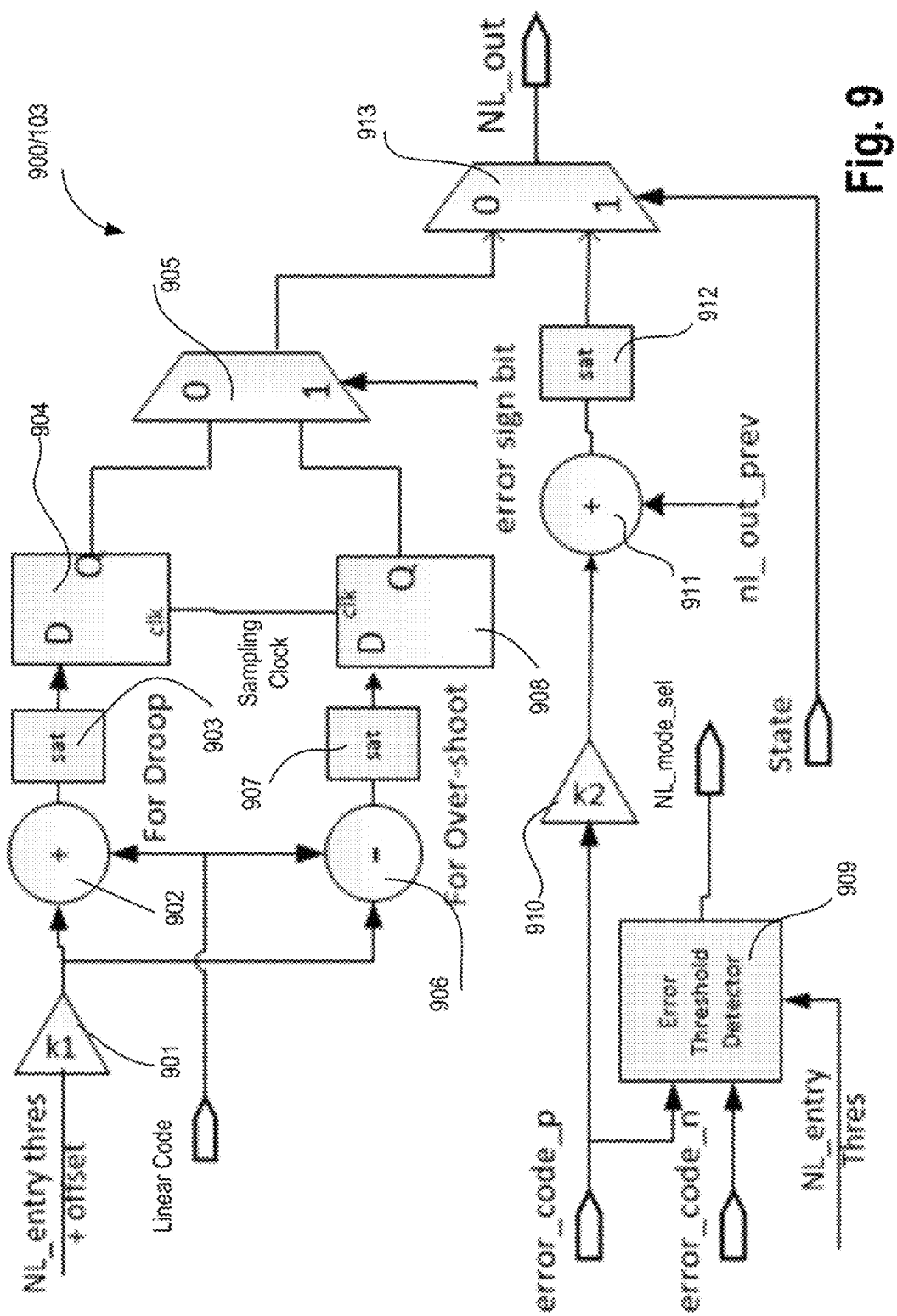
FIG. 9 illustrates a non-linear control logic architecture for the digital LDO regulator, according to some embodiments of the disclosure.

FIG. 9 illustrates NL control logic 900 (e.g., 103) architecture for the digital LDO regulator, according to some embodiments of the disclosure. It is pointed out that those elements of FIG. 9 having the same reference numbers (or names) as the elements of any other figure can operate or function in any manner similar to that described, but are not limited to such.

NL control logic 900 comprises gain stages 901 and 910, summing nodes or summers 902, 906, and 911; Saturation (sat) blocks 903, 907, and 912; flip-flops 904 and 908; error threshold detector 909; and multiplexers 905 and 913 coupled together as shown. In some embodiments, sat blocks 903, 907, and 912 limit the code within min-to-max range and avoid over-flow.

In some embodiments, once the ADC error_code (e.g., error_code_p and error_code_n) crosses a pre-defined entry threshold on either clock edge, the controller enters nonlinear mode autonomously. For example, the "nl_mode_en" signal goes HIGH and controller output switches to a precomputed code which is addition or subtraction of a fixed tunable value to the previous cycle "Linear_code" and selected appropriately by detecting a droop or an over-shoot. Here, NL_out (same as Nonlinear code)=dlc_out_prev+/−K1*(nl_entry_thres+offset), where, K1 901 is a multiplier factor in power of two to realize it as a shifter, "nl_entry_thres" is the error code threshold for NL entry (e.g., +/−4 typically), and "offset" is a tunable value to compensate for the time delay in the loop and also gets adjusted based on target "Vout" with prior information on maximum load current Vs output voltage for the load. After the first cycle of nonlinear correction applied, "NL_out" is computed every cycle using the dynamic error code on positive edge. In some embodiments, the "NL_out" code increments/decrements by K2*error_code_p every cycle until the error_code crosses the NL exit threshold. In some embodiments, K2 910 is a multiplier factor much smaller than K1 901 in order to apply fine steps and avoid any overshoot while recovery. The "NL_out" code is written back to linear controller to ensure smooth switching between modes at NL exit before DLC 800 settles to new "Linear_code" code to maintain zero error in steady-state.

FIG. 10 illustrates TDC post processing logic circuitry 1000 (e.g., part of 304 and 305), according to some embodiments of the disclosure. It is pointed out that those elements of FIG. 10 having the same reference numbers (or names) as the elements of any other figure can operate or function in any manner similar to that described, but are not limited to such.

In some embodiments, TDC post processing logic circuitry 1000 comprises a plurality of samplers 1002 coupled to delay line 1000 (same as 600), inverters 1003, edge pointer logic 1004 (e.g., rising edge pointer (Ptr) 1004a and falling edge pointer 1004b); logic 1005 to determine whether Rise Start Ptr is less than or greater than Fall Start Ptr; multiplexers 1006 (e.g., 1006a and 1006b) and 1008; logic 1007, and comparing logic 1009. The various blocks of TDC post processing logic circuitry 1000 are illustrated in a functional flow starting from delay line 1001 and ending with comparing logic 1009. However, this functional view can also be used as a basis for the actual circuit architecture.

In some embodiments, the data pattern (e.g., outputs d0-d63 of the delay cells) is reversed (e.g., d63-d0) before the logic operates so that the most recent transition data shifts from the most significant bit (MSB) to the least significant bit (LSB) to make logic simpler. One way to reverse the data pattern is to couple the LSB of delay line 1001 to the MSB sampler among plurality of samplers 1002. The samplers are clocked by sampling clock Fclk. In some embodiments, two identical post-processing (PP) modules (TDC PP UNIT) 1004a/b operate in parallel on the sampled reversed data pattern (and its inverse provided by inverters 1003) to extract the positions of both rising and falling edge transitions. In some embodiments, the sampled data is inverted before feeding to the falling edge TDC PP Unit 1004b in order to have identical logic circuitries both detecting rising edge transitions for modularity.

In some embodiments, the rising edge TDC PP UNIT 1004a gives out positions of the most latest 0→1 transition as Rise Start Pointer (Rise Start Ptr) and the position of the previous 0→1 transition as Rise End Pointer (Rise End Ptr) in terms of binary code. In some embodiments, the falling edge TDC PP UNIT 1004b gives out similar info for the 1→0 transitions as "Fall Start Ptr" and "Fall End Ptr". When logic 1005 determines that "Rise Start Ptr" is less than "Fall Start Ptr", then multiplexers 1006a and 1006b select the Rise Start and End Pointers as "Final Start Ptr" and "Final End Prt", respectively, for clock period estimation, if not then logic 1005 selects the Fall pointers as "Final Start Ptr" and "Final End Prt". The difference in the selected start and end pointers gives the TDC binary count by comparing logic 1009 corresponding to the latest clock period in the data pattern, according to various embodiments.

In some embodiments, the end pointer is saturated to a maximum code if the end pointer position is not detected in the data pattern and the end pointer output value is Zero. In some embodiments, logic 1007 deermines whether the "Final End Prt" is equal to zero. If the "Final End Prt" is equal to zero, then maximum count (Max_cnt) is provided as output of multiplexer 1008, otherwise "Final End Ptr" is provided as output of multiplexer 1008. The delay line is designed to be long enough to avoid this scenario, but saturation is still done as a safety feature so that the logic works even if the oscillator frequency lower under any circumstances such as PVT (process, voltage, and temperature) conditions.

FIG. 11 illustrates circuitry 1100, in the TDC post processing logic circuitry, for determining start and end pointers of a clock edge input to the TDC, according to some embodiments of the disclosure. It is pointed out that those elements of FIG. 11 having the same reference numbers (or names) as the elements of any other figure can operate or function in any manner similar to that described, but are not limited to such.

Circuitry 1100 is illustrated as a functional flow and a person skilled in the art can reduce the logic of circuitry 1100 further to reduce gate count, in accordance with some embodiments. Circuitry 1100 is a plurality of combination logic including logic 1101 for bubble correction, logic 1102 to determine leading transition by performing bubbled AND operation, logic 1103 having two's complement logic 1103a and logical AND 1103b, inverters 1104, one hot to binary converter 1105, logical AND 1106, logic 1107 having two's complement logic 1107a and logical AND 1107b, and one hot to binary converter 1108.

In some embodiments, the data pattern after bubble correction by logic 1101 goes through bubbled AND operation by logic 1102 on the consecutive bits to extract the position of the rising edge transitions. For example, bubbled AND output is 01 . . . 00000100000001000. In some embodiments, the spacing between the first two 1's in this data stream from the right determines the latest oscillator clock period based on time resolution of the delay-line. The scheme then uses the property of 2's complement by logic 1103a to determine the spacing and reduces the computational delay of the post-processing, according to some embodiments.

In some embodiments, the data pattern after bubbled AND operation by logic 1101 goes through a logic AND operation by logic 1103b with its 2's complement to give a one-hot code with '1' at the position of the latest 0→1 transition. This one-hot code is then converted to binary by converter 1105 and called as Start Pointer (e.g., Rise Start Ptr).

The position of the previous 0→1 transition e.g., End Pointer, is found by using the existing Start Pointer one-hot code to obtain an intermediate data pattern. This intermediate data goes through a logic AND operation by logic 1107a with its 2's complement to give a one-hot code with '1' at the position of the previous 0→1 transition. This one-hot code is then converted to binary by converter 1108 and called as End Pointer. The start and end pointers are used to compute the final binary count of each TDC corresponding to the latest oscillator clock period, in accordance with some embodiments.

The TDC scheme of various embodiments assists with achieving high-speed conversion of voltage error into digital error code for a time-based ADC compared to previous known techniques. The ADC resolution may further improve as the design moves to newer technologies with smaller channel length, as both oscillator frequency range and the time resolution improves with smaller gate delays. TDC post-processing logic 1100 delay is independent of the length of the data pattern from the delay line, according to various embodiments.

Figure 12A:
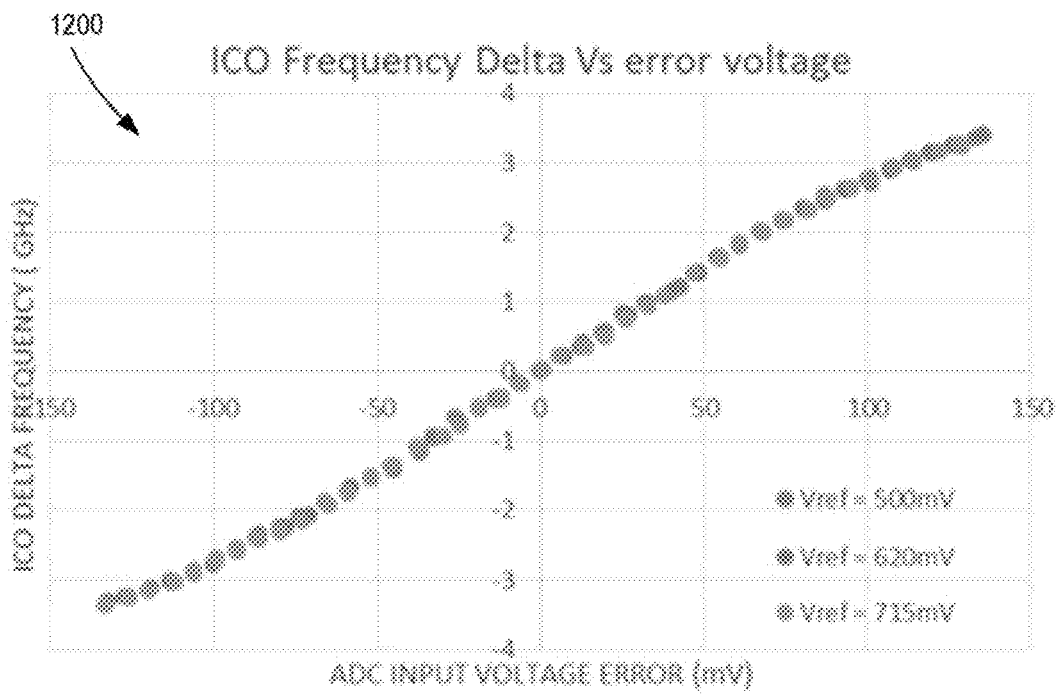
FIGS. 12A-D illustrate performance of the digital LDO regulator, according to some embodiments of the disclosure.
Figure 12B:
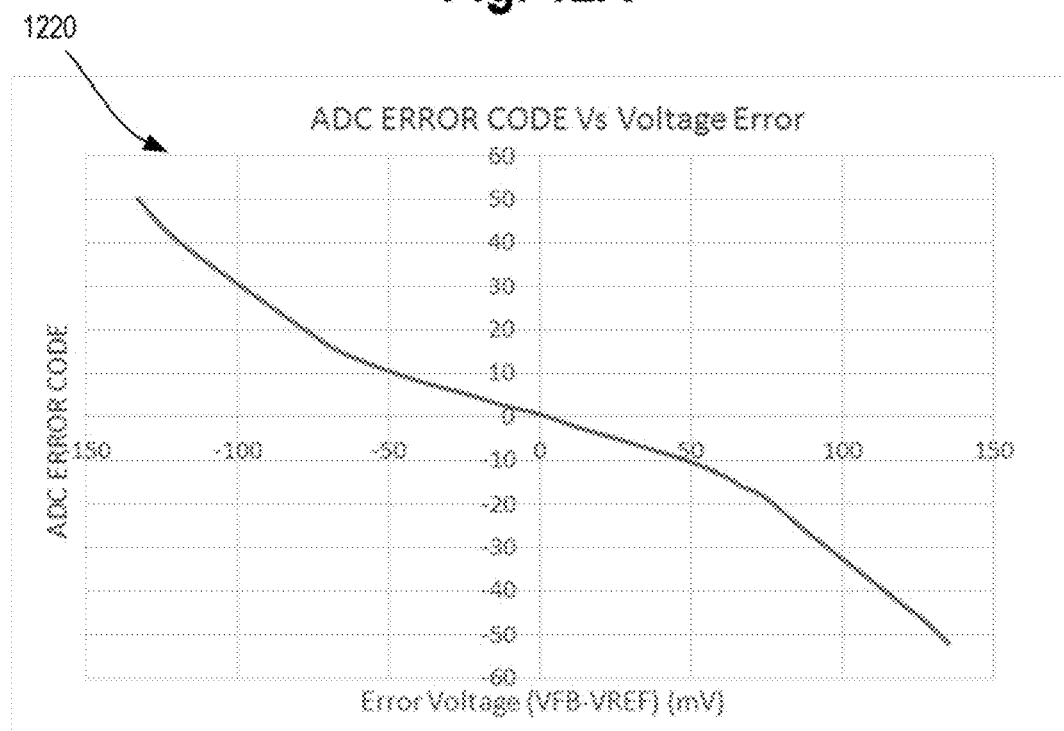
Figure 12C:
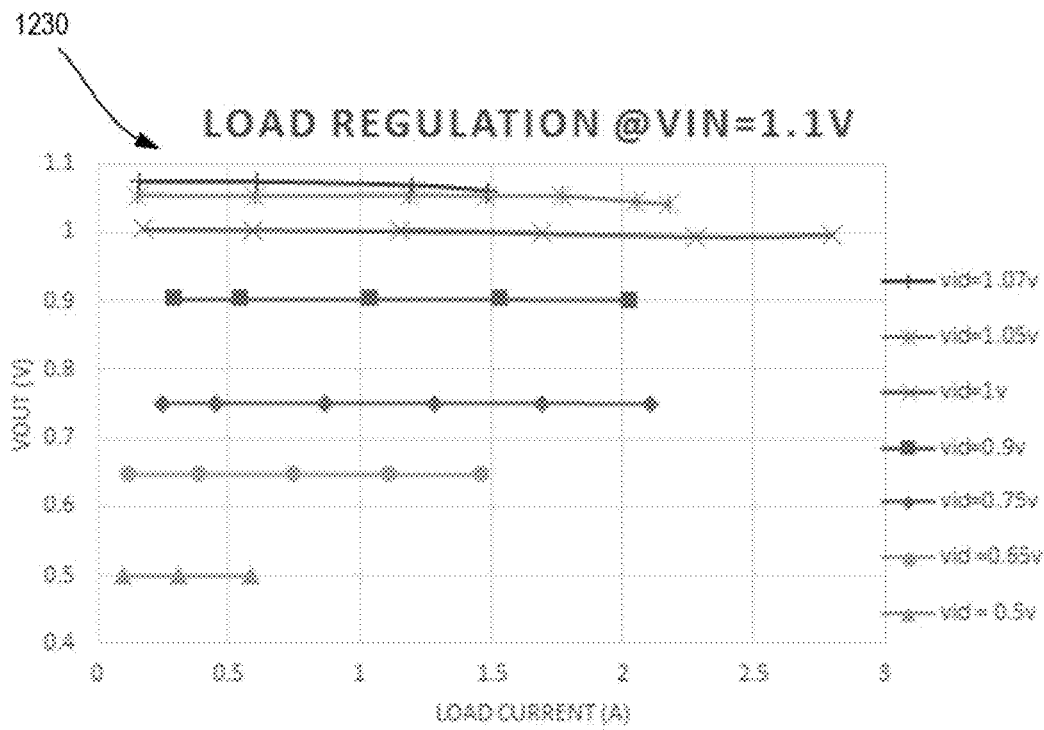
Figure 12D:
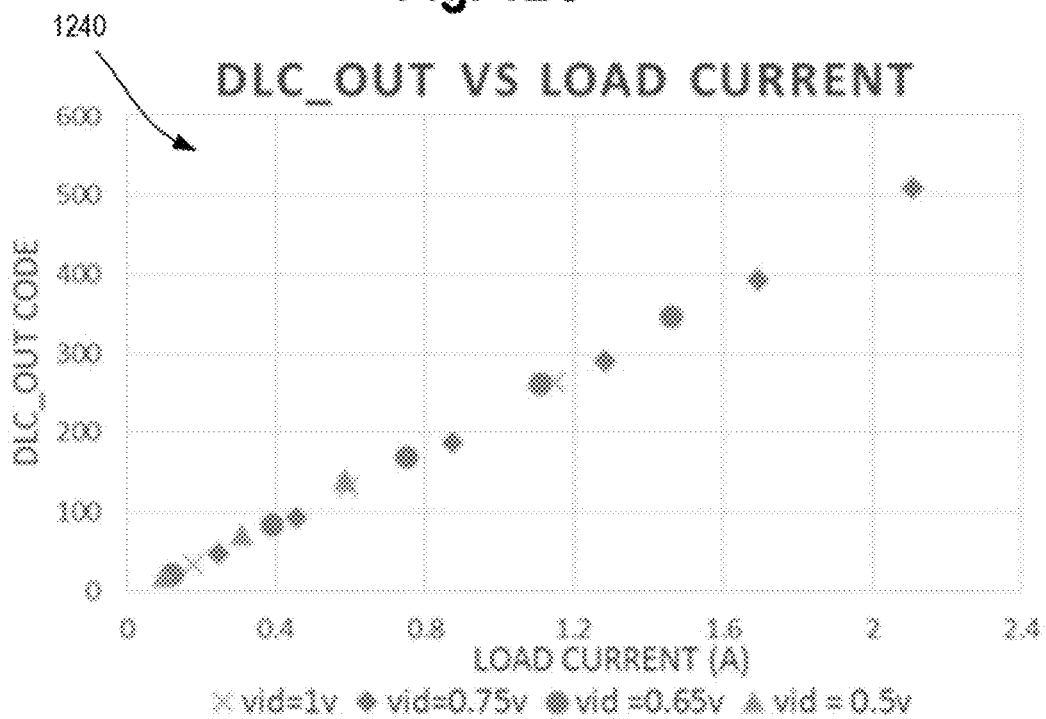

FIGS. 12A-D illustrate performance of the digital LDO regulator, according to some embodiments of the disclosure. FIG. 12A illustrates plot 1200 illustrating oscillator clock frequency difference versus error voltage. Here, the x-axis is ADC input voltage error in mV (e.g., difference in TDC1_count and TDC2_Count) while the y-axis is oscillator frequency difference (e.g., difference in outputs of oscillator 302 and 303) in GHz (Giga-Hertz). Plot 1200 shows the delta in the oscillator frequencies varies almost linearly with error voltage. FIG. 12B illustrates plot 1220 which shows ADC resolution of 5 mV/code in +/−50 mV error range in which DLC operates and the resolution improves when the error becomes large. This helps in faster recovery from large droops as the novel nonlinear control technique recovers looking at the dynamic error code. FIG. 12C illustrates plot 1230 which shows the measured results in a closed-loop for load regulation at different dropout voltages. It shows max load current of 1.5 A (Amperes) and 2.2 A at 30 mV and 50 mV dropout, respectively. FIG. 12D illustrates plot 1240 which shows almost linearly changing "Linear code" with load current when Power-FETs 105 are operating in constant-current mode with nearly 4 mA current per leg in 0.5 V to 1.0 V output at 1.1 V input.

Figure 13:
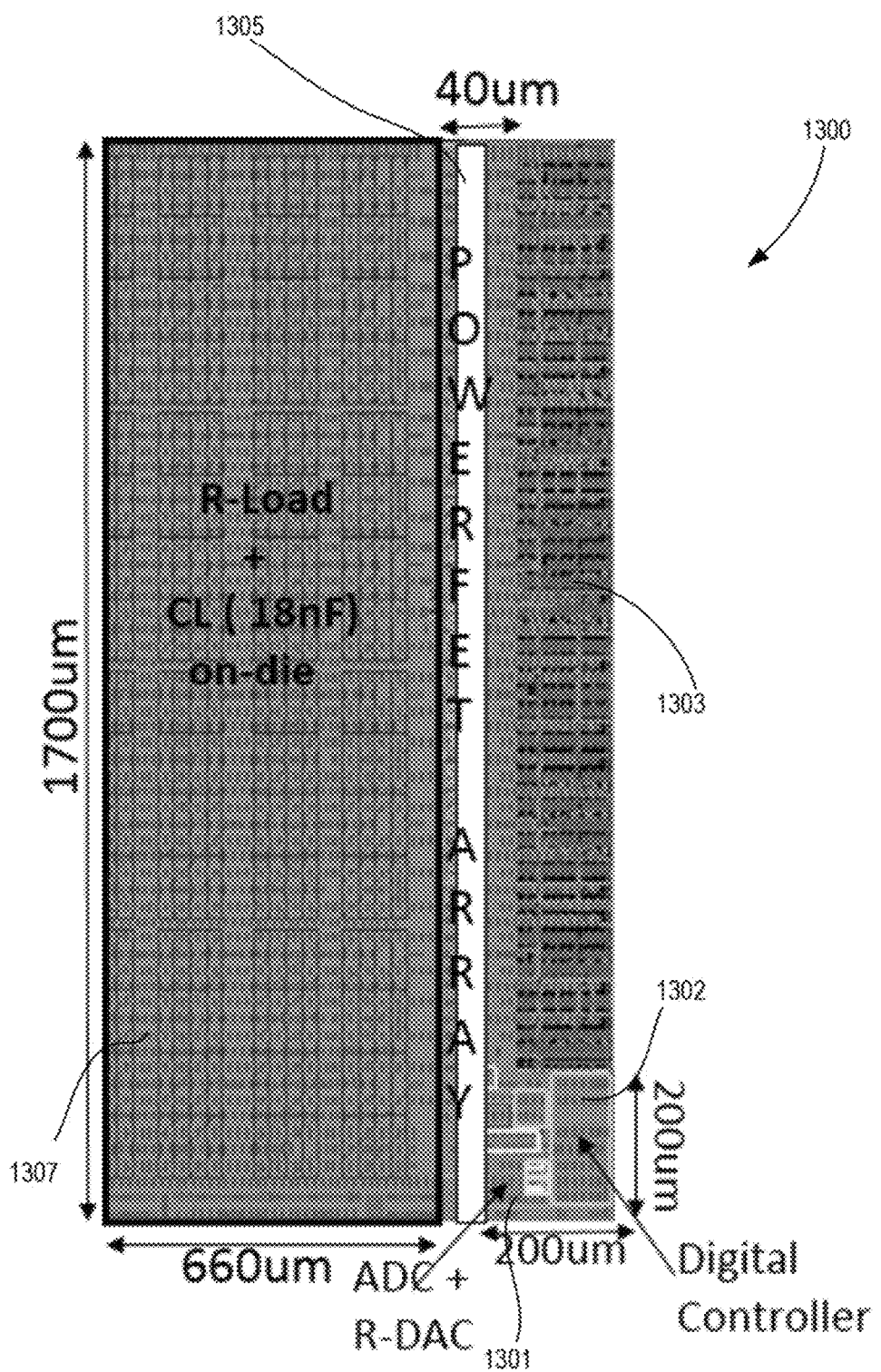
FIG. 13 illustrates a layout floorplan of the digital LDO regulator, according to some embodiments of the disclosure.

FIG. 13 illustrates a layout floorplan 1300 of the digital LDO regulator, according to some embodiments of the disclosure. Layout 1300 illustrates relative areas 1301 (resister or current DAC 401/301a of V2I Converter 400), 1302 (DLC 102), 1303, power gate array 1305/105, load capacitor 1307. In this example, the power-FETs active area is 0.068 mm$^2$ and controller area is 0.036 mm$^2$.

FIG. 14 illustrates a table 1400 showing performance of the LDO of FIG. 1 over prior art LDOs (PA1, PA2, PA3, and PA4), according to some embodiments of the disclosure. In this example, the regulator is able to operate for wide dropout range with output varying between 0.5 V to 1.12 V and greater than 22× load current range from 0.1 A to 2.2 A with less than 0.006 mV/mA of load regulation. The reduced conversion delay achieved for the oscillator-based ADC enables fast-response. The novel non-linear control logic compliments the linear control during load-transients to prevent large droops and initiate smooth and speed recovery.

Figure 15:
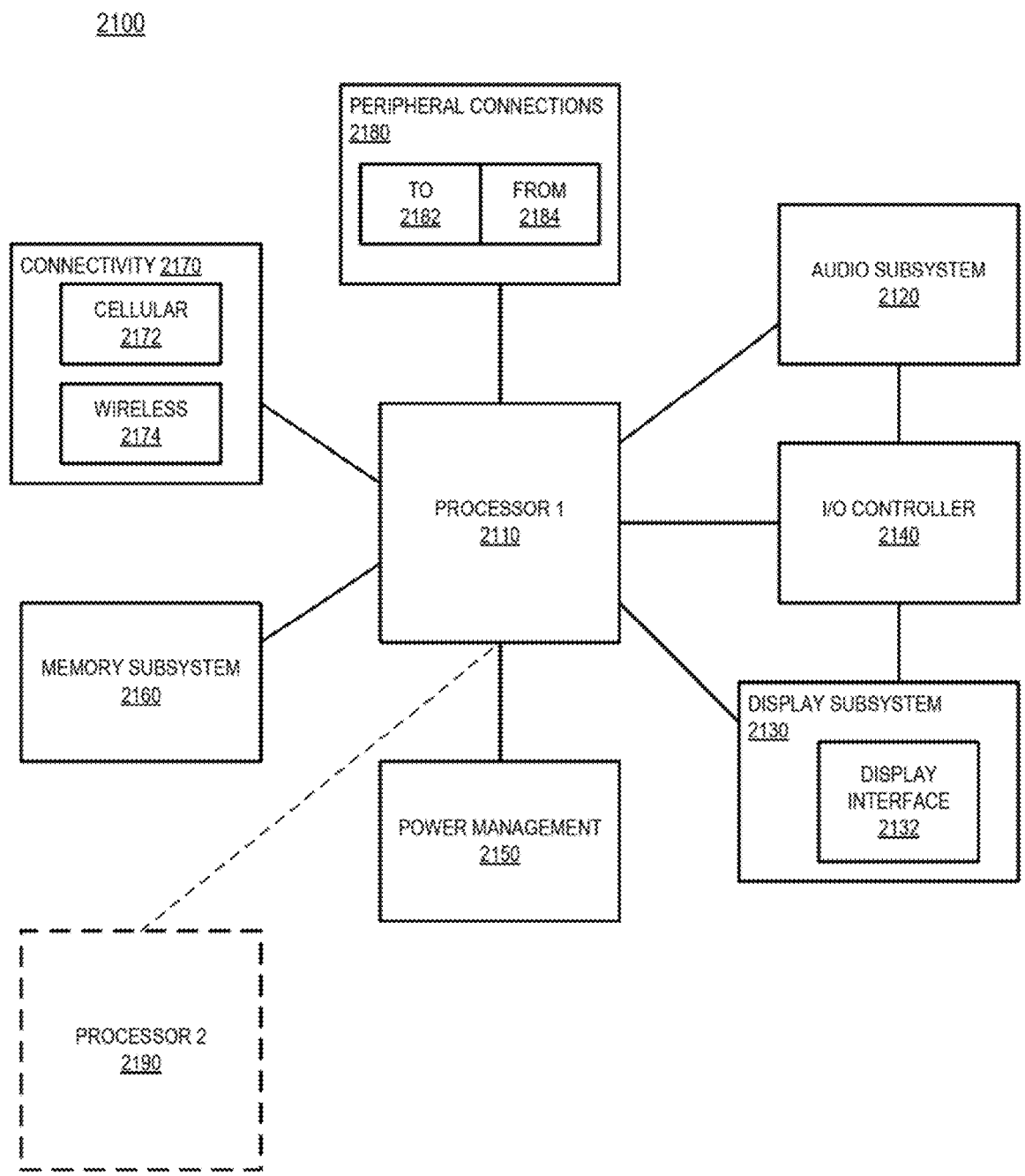
FIG. 15 illustrates a smart device or a computer system or a SoC (System-on-Chip) with a TDC, according to some embodiments.

FIG. 15 illustrates a smart device or a computer system or a SoC (System-on-Chip) with a TDC, according to some embodiments. It is pointed out that those elements of FIG. 15 having the same reference numbers (or names) as the elements of any other figure can operate or function in any manner similar to that described, but are not limited to such.

FIG. 15 illustrates a block diagram of an embodiment of a mobile device in which flat surface interface connectors could be used. In some embodiments, computing device 2100 represents a mobile computing device, such as a computing tablet, a mobile phone or smart-phone, a wireless-enabled e-reader, or other wireless mobile device. It will be understood that certain components are shown generally, and not all components of such a device are shown in computing device 2100.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, etc., may be used without departing from the scope of the disclosure.

Any of the blocks here may include the TDC of various embodiments.

In some embodiments, computing device 2100 includes a first processor 2110. The various embodiments of the present disclosure may also comprise a network interface within 2170 such as a wireless interface so that a system embodiment may be incorporated into a wireless device, for example, cell phone or personal digital assistant.

In one embodiment, processor 2110 can include one or more physical devices, such as microprocessors, application processors, microcontrollers, programmable logic devices, or other processing means. The processing operations performed by processor 2110 include the execution of an operating platform or operating system on which applications and/or device functions are executed. The processing operations include operations related to I/O (input/output) with a human user or with other devices, operations related to power management, and/or operations related to connecting the computing device 2100 to another device. The processing operations may also include operations related to audio I/O and/or display I/O.

In one embodiment, computing device 2100 includes audio subsystem 2120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2100, or connected to the computing device 2100. In one embodiment, a user interacts with the computing device 2100 by providing audio commands that are received and processed by processor 2110.

Display subsystem 2130 represents hardware (e.g., display devices) and software (e.g., drivers) components that provide a visual and/or tactile display for a user to interact with the computing device 2100. Display subsystem 2130 includes display interface 2132, which includes the particular screen or hardware device used to provide a display to a user. In one embodiment, display interface 2132 includes logic separate from processor 2110 to perform at least some processing related to the display. In one embodiment, display subsystem 2130 includes a touch screen (or touch pad) device that provides both output and input to a user.

I/O controller 2140 represents hardware devices and software components related to interaction with a user. I/O controller 2140 is operable to manage hardware that is part of audio subsystem 2120 and/or display subsystem 2130. Additionally, I/O controller 2140 illustrates a connection point for additional devices that connect to computing device 2100 through which a user might interact with the system. For example, devices that can be attached to the computing device 2100 might include microphone devices, speaker or stereo systems, video systems or other display devices, keyboard or keypad devices, or other I/O devices for use with specific applications such as card readers or other devices.

As mentioned above, I/O controller 2140 can interact with audio subsystem 2120 and/or display subsystem 2130. For example, input through a microphone or other audio device can provide input or commands for one or more applications or functions of the computing device 2100. Additionally, audio output can be provided instead of, or in addition to display output. In another example, if display subsystem 2130 includes a touch screen, the display device also acts as an input device, which can be at least partially managed by I/O controller 2140. There can also be additional buttons or switches on the computing device 2100 to provide I/O functions managed by I/O controller 2140.

In one embodiment, I/O controller 2140 manages devices such as accelerometers, cameras, light sensors or other environmental sensors, or other hardware that can be included in the computing device 2100. The input can be part of direct user interaction, as well as providing environmental input to the system to influence its operations (such as filtering for noise, adjusting displays for brightness detection, applying a flash for a camera, or other features).

In one embodiment, computing device 2100 includes power management 2150 that manages battery power usage, charging of the battery, and features related to power saving operation. Memory subsystem 2160 includes memory devices for storing information in computing device 2100. Memory can include nonvolatile (state does not change if power to the memory device is interrupted) and/or volatile (state is indeterminate if power to the memory device is interrupted) memory devices. Memory subsystem 2160 can store application data, user data, music, photos, documents, or other data, as well as system data (whether long-term or temporary) related to the execution of the applications and functions of the computing device 2100.

Elements of embodiments are also provided as a machine-readable medium (e.g., memory 2160) for storing the computer-executable instructions. The machine-readable medium (e.g., memory 2160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 2170 includes hardware devices (e.g., wireless and/or wired connectors and communication hardware) and software components (e.g., drivers, protocol stacks) to enable the computing device 2100 to communicate with external devices. The computing device 2100 could be separate devices, such as other computing devices, wireless access points or base stations, as well as peripherals such as headsets, printers, or other devices.

Connectivity 2170 can include multiple different types of connectivity. To generalize, the computing device 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2174 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 2180 include hardware interfaces and connectors, as well as software components (e.g., drivers, protocol stacks) to make peripheral connections. It will be understood that the computing device 2100 could both be a peripheral device ("to" 2182) to other computing devices, as well as have peripheral devices ("from" 2184) connected to it. The computing device 2100 commonly has a "docking" connector to connect to other computing devices for purposes such as managing (e.g., downloading and/or uploading, changing, synchronizing) content on computing device 2100. Additionally, a docking connector can allow computing device 2100 to connect to certain peripherals that allow the computing device 2100 to control content output, for example, to audiovisual or other systems.

In addition to a proprietary docking connector or other proprietary connection hardware, the computing device 2100 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

In example 1, an apparatus is provided comprising a first clock line to provide a first clock; a second clock line to provide a second clock; a delay line having a plurality of delay cells, wherein the delay line is coupled to the first and second clock lines, and wherein the first clock is to sample the second clock; and a circuitry coupled to the delay line, wherein the circuitry is to determine first edge transition from the outputs of the plurality of delay cells.

Example 2 is provided which includes features of example 1, wherein the first clock has a frequency which is higher than a frequency of the second clock.

Example 3 is provided which includes features of example 1, wherein at least one delay cell of the plurality includes first and second sequential circuits, and wherein the first sequential circuit is to receive at its clock input the first clock while the second sequential circuit is to receive at its clock input an inverse of the first clock.

Example 4 is provided which includes features of example 3, wherein the one delay cell comprises a buffer coupled to the second clock line, and wherein an output of the buffer is coupled to data inputs of the first and second sequential circuits.

Example 5 is provided which includes features of example 1, wherein the circuitry comprises a plurality of samplers coupled to the plurality of delay cells and the first clock line, and wherein outputs of the plurality of delay cells are sampled by the samplers.

Example 6 is provided which includes features of example 5, wherein the plurality of samplers are coupled to plurality of delay cells such that output of a first delay cell is coupled to an input of a last sampler.

Example 7 is provided which includes features of example 5, wherein the circuitry comprises: a first set of combinational circuitry to receive outputs of the plurality of samplers; and a second set of combinational circuitry to receive complementary outputs of the plurality of samplers, wherein the first set of combinational circuitry is to determine a rising edge start pointer and a rising edge fall pointer associated with the second clock, and wherein the second set of combinational circuitry is to determine a rising edge start pointer and a rising edge fall pointer associated with the second clock.

Example 8 is provided which includes features of example 7, wherein the circuitry comprises: a first multiplexer circuitry to receive the rising edge start pointer and a falling edge start pointer, wherein the first multiplexer circuitry is to generate a first output which is to indicate a final edge start pointer; and a second multiplexer circuitry to receive the rising edge end pointer and a falling edge end pointer, wherein the second multiplexer circuitry is to generate a second output which is to indicate a final edge end pointer, and wherein the first and second multiplexer circuitry are controllable by a select line.

Example 9 is provided which includes features of example 8, wherein the select line is to provide a logic level according to whether the rising edge start pointer arrive earlier than the falling edge start pointer.

Example 10 is provided which includes feature of example 8, wherein the apparatus comprises a comparing circuitry which is to determine a difference between the final edge end pointer and the final edge start pointer, wherein the comparing circuitry is to generate an output which is a bus indicating a time distance between the final edge end pointer and the final edge start pointer.

Example 11 is provided which includes features of example 5, wherein the first set of combinational logic circuitry comprises: a bubble correction circuitry to receive the outputs of the plurality of samplers; a first AND circuitry coupled to the bubble correction circuitry, wherein the first AND circuitry is to perform AND logic operation on outputs of the bubble correction circuitry; a second AND circuitry coupled to the first AND circuitry; a first two's complement circuitry coupled to the first AND circuitry, wherein the second AND circuitry is to perform AND logic operation on outputs of the first AND circuitry and outputs of the first two's complement circuitry; a set of inverters coupled to the second AND circuitry; a third AND circuitry coupled to the set of inverters and the first AND circuitry, wherein the third AND circuitry is to perform AND logic operation on outputs of the set of inverters and the outputs of the first AND circuitry; and a first 1-hot-to-binary converter coupled to the second AND circuitry, wherein the first 1-hot-to-binary converter is to receive outputs of the second AND circuitry and is to generate the rising edge start pointer.

Example 12 is provided which includes features of example 11, wherein the first set of combinational circuitry comprises: a second two's complement circuitry coupled to the third AND circuitry; a fourth AND circuitry coupled to the second two's complement and the third AND circuitry, wherein the fourth AND logic is to perform AND logic operation on outputs of the third AND circuitry and outputs of the second two's complement circuitry; and a second 1-hot-to-binary converter circuitry coupled to an output of the fourth AND circuitry, wherein the second 1-hot-to-binary converter is to receive outputs of the fourth AND circuitry and is to generate the rising edge end pointer.

Example 13 is an apparatus which comprises: a voltage to current converter coupled to a reference voltage line and a feedback voltage line; a first oscillator coupled to a first output of the voltage to current converter; a second oscillator coupled to a second output of the voltage to current converter; a first time-to-digital converter (TDC) coupled to an output of the first oscillator; a second TDC coupled to an output of the second oscillator; and a subtracting circuitry coupled to outputs of the first and second TDC, wherein each of the first and second TDCs comprises: a first clock line to provide a first clock; a second clock line to provide a second clock; a delay line having a plurality of delay cells, wherein the delay line is coupled to the first and second clock lines, wherein the first clock is to sample the second clock; and a circuitry coupled to the delay line, wherein the circuitry is to determine first edge transition from the outputs of the plurality of delay cells.

Example 14 includes features of example 12, which comprises: a digital filter coupled to an output of the subtracting circuitry.

Example 15 includes features of example 14, wherein the apparatus comprises one or more power transistors coupled to an input supply node and an output supply node, wherein gate terminals of the one or more power transistors are controllably by an output of the digital filter.

Example 16 includes features of example 15, wherein the apparatus comprises: a voltage divider coupled to the output supply node and the feedback voltage line.

Example 17 is a system which comprises: a memory; a processor coupled to the memory, wherein the processor includes a time-to-digital converter (TDC) which comprises: a first clock line to provide a first clock; a second clock line to provide a second clock; a delay line having a plurality of delay cells, wherein the delay line is coupled to the first and second clock lines, wherein the first clock is to sample the second clock; and a circuitry coupled to the delay line, wherein the circuitry is to determine first edge transition from the outputs of the plurality of delay cells; and a wireless interface to allow the processor to communicate with another device.

Example 18 includes all features of example 17, wherein the processor includes a digital low dropout (LDO) regulator which includes the TDC.

Example 19 includes all features of example 17, wherein the processor includes an analog-to-digital converter (ADC) which includes the TDC.

Example 20 includes all features of example 17, wherein the system comprises a display which is communicatively coupled to the processor.

Example 21 includes all features of example 17, wherein the processor includes an apparatus according to any one of examples 2 to 12.

Example 22 is a system which comprises: a memory; a processor coupled to the memory, the processor including an apparatus according to any one of examples 13 to 16; and a wireless interface to allow the processor to communicate with another device.

Example 23 is an apparatus which comprises: a first clock line to provide a first clock; a second clock line to provide a second clock; a delay line having a plurality of delay cells, wherein the delay line is coupled to the first and second clock lines, and wherein the first clock is to sample the second clock; and a circuitry coupled to the delay line, wherein the circuitry is to determine latest edge transition from the outputs of the plurality of delay cells.

Example 24 includes all features of example 23, wherein the apparatus of example 24 is according to any one of examples 2 to 12.

Example 25 is an apparatus which comprises: a voltage to current converter coupled to a reference voltage line and a feedback voltage line; a first oscillator coupled to a first output of the voltage to current converter; a second oscillator coupled to a second output of the voltage to current converter; a first time-to-digital converter (TDC) coupled to an output of the first oscillator; a second TDC coupled to an output of the second oscillator; and a subtracting circuitry coupled to outputs of the first and second TDC, wherein each of the first and second TDCs comprises: a first clock line to provide a first clock; a second clock line to provide a second clock; a delay line having a plurality of delay cells, wherein the delay line is coupled to the first and second clock lines, wherein the first clock is to sample the second clock; and a circuitry coupled to the delay line, wherein the circuitry is to determine a latest edge transition from the outputs of the plurality of delay cells.

Example 26 includes all features of example 25, wherein the apparatus is according to any one of examples 13 to 16.

Example 27 is a method which comprises: providing a first clock; providing a second clock; receiving outputs of the plurality of samplers; receiving complementary outputs of a plurality of samplers; determining a rising edge start pointer and a rising edge fall pointer associated with a second clock, and determining a rising edge start pointer and a rising edge fall pointer associated with the second clock.

Example 28 includes all features of example 27, wherein the method comprises: receiving the rising edge start pointer and a falling edge start pointer; generating a first output which is to indicate a final edge start pointer; receiving the rising edge end pointer and a falling edge end pointer; and generating a second output which is to indicate a final edge end pointer.

Example 29 includes all features of example 28, wherein the method comprises providing a logic level according to whether the rising edge start pointer arrive earlier than the falling edge start pointer.

Example 30 includes all features of example 29, wherein the method comprises: determining a difference between the final edge end pointer and the final edge start pointer; and generating an output which is a bus indicating a time distance between the final edge end pointer and the final edge start pointer.

Example 31 is an apparatus which comprises: means for providing a first clock; means for providing a second clock; means for receiving outputs of the plurality of samplers; means for receiving complementary outputs of a plurality of samplers; means for determining a rising edge start pointer and a rising edge fall pointer associated with a second clock, and means for determining a rising edge start pointer and a rising edge fall pointer associated with the second clock.

Example 32 includes all features of example 31, wherein the apparatus comprises: means for receiving the rising edge start pointer and a falling edge start pointer; means for generating a first output which is to indicate a final edge start pointer; means for receiving the rising edge end pointer and a falling edge end pointer; and means for generating a second output which is to indicate a final edge end pointer.

Example 33 includes all features of example 32, wherein the apparatus comprises: means for providing a logic level according to whether the rising edge start pointer arrive earlier than the falling edge start pointer.

Example 34 includes all features of example 33, wherein the apparatus comprises: means for determining a difference between the final edge end pointer and the final edge start pointer; and means for generating an output which is a bus indicating a time distance between the final edge end pointer and the final edge start pointer.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus comprising:
    an oscillator based analog-to-digital converter (ADC) coupled to a reference line and a feedback line, wherein the reference line is to provide a reference voltage, and wherein the feedback line is to provide a feedback voltage;
    a first filter coupled to an output of the oscillator based ADC, wherein the first filter comprises linear control; and
    a second filter coupled to the output of the oscillator based ADC, wherein the second filter comprises non-linear control.

2. The apparatus of claim 1 comprises a multiplexer coupled to an output of the first filter and coupled to an output of the second filter, wherein the multiplexer is to select, as an output of the multiplexer, one of the output of the first filter or the output of the second filter.

3. The apparatus of claim 2 comprises a power gate circuitry controllable by the output of the multiplexer.

4. The apparatus of claim 3, wherein the feedback line is coupled to the power gate circuitry.

5. The apparatus of claim 3 comprises a divider coupled to the power gate circuitry, wherein the feedback line is coupled to an output of the divider.

6. The apparatus of claim 5, wherein the multiplexer is a first multiplexer, wherein the divider comprises a resistor ladder and a second multiplexer coupled to the resistor ladder, and wherein an output of the second multiplexer is coupled to the feedback line.

7. The apparatus of claim 3, wherein the power gate circuitry comprises a plurality of series coupled devices, wherein each series coupled device includes a first transistor and a second transistor, wherein the first transistor has a gate terminal coupled to a bias, and wherein the second transistor has a gate terminal coupled to the output of the multiplexer.

8. The apparatus of claim 1, wherein the oscillator based ADC comprises:
    a first clock line to provide a first clock;
    a second clock line to provide a second clock;
    a delay line having a plurality of delay cells, wherein the delay line is coupled to the first and second clock lines, wherein the first clock is to sample the second clock, and wherein an individual delay cell of the plurality includes a sequential circuit; and
    a circuitry coupled to the delay line, wherein the circuitry is to determine a first edge transition from the outputs of the plurality of delay cells, wherein the circuitry comprises a plurality of samplers coupled to the plurality of delay cells and the first clock line, and wherein outputs of the plurality of delay cells are sampled by the samplers.

9. The apparatus of claim 8, wherein the first clock has a frequency which is higher than a frequency of the second clock.

10. The apparatus of claim 1, wherein the oscillator based ADC comprises:
    a first clock line to provide a first clock;
    a second clock line to provide a second clock;
    a delay line having a plurality of delay cells, wherein the delay line is coupled to the first and second clock lines, wherein the first clock is to sample the second clock, and wherein an individual delay cell of the plurality includes a sequential circuit; and
    a circuitry coupled to the delay line, wherein the circuitry is to determine a first edge transition from the outputs of the plurality of delay cells, wherein the first clock has a frequency which is higher than a frequency of the second clock.

11. The apparatus of claim 1, wherein the oscillator based ADC comprises:
    a voltage to current converter coupled to a reference voltage line and a feedback voltage;
    a first oscillator coupled to a first output of the voltage to current converter;
    a second oscillator coupled to a second output of the voltage to current converter;
    a first time-to-digital converter (TDC) coupled to an output of the first oscillator;
    a second TDC coupled to an output of the second oscillator; and
    a subtracting circuitry coupled to outputs of the first and second TDC.

12. The apparatus of claim 11, wherein each of the first and second TDCs comprises:
    a first clock line to provide a first clock;
    a second clock line to provide a second clock;
    a delay line having a plurality of delay cells, wherein the delay line is coupled to the first and second clock lines, wherein the first clock is to sample the second clock; and circuitry coupled to the delay line, wherein the circuitry is to determine latest edge transition from the outputs of the plurality of delay cells.

13. An apparatus comprising:
an oscillator based analog-to-digital converter (ADC) coupled to a reference line and a feedback line, wherein the reference line is to provide a reference voltage, and wherein the feedback line is to provide a feedback voltage, wherein the oscillator based ADC includes a time-to-digital converter;
a filter coupled to an output of the oscillator based ADC; and
a power gate controllable by an output of the filter.

14. The apparatus of claim 13, wherein the oscillator based ADC comprises:
a first clock line to provide a first clock;
a second clock line to provide a second clock;
a delay line having a plurality of delay cells, wherein the delay line is coupled to the first and second clock lines, wherein the first clock is to sample the second clock, and wherein an individual delay cell of the plurality includes a sequential circuit; and
a circuitry coupled to the delay line, wherein the circuitry is to determine a first edge transition from the outputs of the plurality of delay cells, wherein the circuitry comprises a plurality of samplers coupled to the plurality of delay cells and the first clock line, and wherein outputs of the plurality of delay cells are sampled by the samplers.

15. The apparatus of claim 14, wherein the oscillator based ADC comprises:
a voltage to current converter coupled to a reference voltage line and a feedback voltage line;
a first oscillator coupled to a first output of the voltage to current converter;
a second oscillator coupled to a second output of the voltage to current converter;
a TDC coupled to an output of the first oscillator;
a second TDC coupled to an output of the second oscillator; and
a subtracting circuitry coupled to outputs of the first and second TDC.

16. The apparatus of claim 13, wherein the oscillator based ADC comprises:
a first clock line to provide a first clock;
a second clock line to provide a second clock;
a delay line having a plurality of delay cells, wherein the delay line is coupled to the first and second clock lines, wherein the first clock is to sample the second clock, and wherein an individual delay cell of the plurality includes a sequential circuit; and
a circuitry coupled to the delay line, wherein the circuitry is to determine a first edge transition from the outputs of the plurality of delay cells, wherein the first clock has a frequency which is higher than a frequency of the second clock.

17. A system comprising:
a memory;
a processor coupled to the memory, wherein the processor includes a low dropout regulator, wherein the low dropout regulator includes:
an oscillator based analog-to-digital converter (ADC) coupled to a reference line and a feedback line, wherein the reference line is to provide a reference voltage, and wherein the feedback line is to provide a feedback voltage;
a first filter coupled to an output of the oscillator based ADC, wherein the first filter comprises linear control; and
a second filter coupled to the output of the oscillator based ADC, wherein the second filter comprises non-linear control; and
an antenna communicatively coupled to the processor.

18. The system of claim 17 comprising: a multiplexer coupled to an output of the first filter and coupled to an output of the second filter, wherein the multiplexer is to select as an output of the multiplexer one of the output of the first filter of the output of the second filter.

19. The system of claim 18 comprising: a power gate circuitry controllable by the output of the multiplexer, wherein the feedback line is coupled to the power gate circuitry, or wherein the system comprises a divider coupled to the power gate circuitry, wherein the feedback line is coupled to an output of the divider.

20. The system of claim 19, wherein the multiplexer is a first multiplexer, wherein the divider comprises a resistor ladder and a second multiplexer coupled to the resistor ladder, wherein an output of the second multiplexer is coupled to the feedback line.

21. An apparatus comprising:
an analog-to-digital converter (ADC) coupled to a reference line and a feedback line, wherein the reference line is to provide a reference voltage, and wherein the feedback line is to provide a feedback voltage;
a first filter coupled to an output of the ADC, wherein the first filter comprises linear control; and
a second filter coupled to the output of the ADC, wherein the second filter comprises non-linear control.

22. The apparatus of claim 21 comprises a multiplexer coupled to an output of the first filter and coupled to an output of the second filter, wherein the multiplexer is to select, as an output of the multiplexer, one of the output of the first filter or the output of the second filter.

23. The apparatus of claim 22 comprises a power gate circuitry controllable by the output of the multiplexer.

* * * * *